United States Patent
Kim et al.

(10) Patent No.: US 9,666,811 B2
(45) Date of Patent: May 30, 2017

(54) ORGANIC COMPOUND AND ORGANIC LIGHT EMITTING DIODE DEVICE INCLUDING THE SAME

(71) Applicants: SAMSUNG DISPLAY CO., LTD., Yongin, Gyeonggi-Do (KR); Pusan National University Industry-University Cooperation Foundation, Busan (KR)

(72) Inventors: Jae Hong Kim, Yongin (KR); Myeong-Suk Kim, Yongin (KR); Soung Wook Kim, Yongin (KR); Hong Suk Suh, Yongin (KR); Jun Kuk Kim, Yongin (KR); Moon Jae Lee, Yongin (KR)

(73) Assignees: SAMSUNG DISPLAY CO., LTD., Yongin, Gyeonggi-do (KR); PUSAN NATIONAL UNIVERSITY INDUSTRY-UNIVERSITY COOPERATION FOUNDATION, Geumjeong-gu, Busan (KR)

( * ) Notice: Subject to any disclaimer, the term of this patent is extended or adjusted under 35 U.S.C. 154(b) by 104 days.

(21) Appl. No.: 14/503,840

(22) Filed: Oct. 1, 2014

(65) Prior Publication Data

US 2015/0090994 A1 Apr. 2, 2015

(30) Foreign Application Priority Data

Oct. 2, 2013 (KR) .................. 10-2013-0118075

(51) Int. Cl.
*H01L 51/00* (2006.01)
*H01L 51/50* (2006.01)

(52) U.S. Cl.
CPC ...... *H01L 51/0071* (2013.01); *H01L 51/0061* (2013.01); *H01L 51/0081* (2013.01);
(Continued)

(58) Field of Classification Search
None
See application file for complete search history.

(56) References Cited

U.S. PATENT DOCUMENTS

| 2007/0089845 | A1 | 4/2007 | Sotzing et al. |
| 2008/0038586 | A1* | 2/2008 | Nishizeki ............... C09K 11/06 |
| | | | 428/704 |

FOREIGN PATENT DOCUMENTS

| KR | 10-2008-0101229 A | 11/2008 |
| KR | 10-2010-0062581 A | 6/2010 |
(Continued)

OTHER PUBLICATIONS

Machine English translation of Suga et al. (WO 2012/176820 A1). May 31, 2016.*

*Primary Examiner* — J. L. Yang
(74) *Attorney, Agent, or Firm* — Lee & Morse, P.C.

(57) ABSTRACT

A compound and an organic light emitting diode device, the compound being represented by the following Chemical Formula 1:

[Chemical Formula 1]

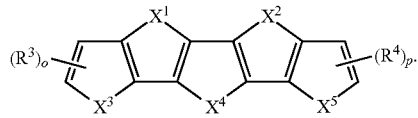

17 Claims, 1 Drawing Sheet

(52) U.S. Cl.
CPC ...... *H01L 51/0085* (2013.01); *H01L 51/5016* (2013.01); *H01L 51/5056* (2013.01); *H01L 51/5072* (2013.01)

(56) References Cited

FOREIGN PATENT DOCUMENTS

| KR | 10-2010-0098293 A | 9/2010 | | |
|----|-------------------|--------|---|---|
| KR | 10-2012-0042633 A | 5/2012 | | |
| WO | WO-2012/176820 A1 | * | 12/2012 | ........... C07D 495/22 |

\* cited by examiner

ORGANIC COMPOUND AND ORGANIC LIGHT EMITTING DIODE DEVICE INCLUDING THE SAME

CROSS-REFERENCE TO RELATED APPLICATION

Korean Patent Application No. 10-2013-0118075, filed on Oct. 2, 2013, in the Korean Intellectual Property Office, and entitled: "Organic Compound And Organic Light Emitting Diode Device Including The Same," is incorporated by reference herein in its entirety.

BACKGROUND

1. Field

Embodiments relate to an organic compound and an organic light emitting diode device including the same.

2. Description of the Related Art

Reductions in size and thickness of a monitor, a television, or the like has promoted replacement of a cathode ray tube (CRT) with a liquid crystal display (LCD). A liquid crystal display (LCD) not only requires a separate backlight (as it is a non-emissive device), but may also have a limit in terms of a response speed, a viewing angle, and the like.

Recently, as a display device to overcome such limits, an organic light emitting diode device has been considered. The organic light emitting diode device is a self-light emitting display device having a wide viewing angle, improved contrasts and a fast response time.

An organic light emitting diode device may include two electrodes and an emission layer therebetween, and may emit a light when electrons injected from one electrode are combined with holes injected from the other electrode and thus, may form excitons and emit energy.

SUMMARY

Embodiments are directed to an organic compound and an organic light emitting diode device including the same.

The embodiments may provide an organic compound being applicable to an organic light emitting diode device.

Another embodiment provides an organic light emitting diode device including the organic compound.

Yet another embodiment provides a display device including the organic light emitting diode device.

One embodiment provides a compound represented by the following Chemical Formula 1.

[Chemical Formula 1]

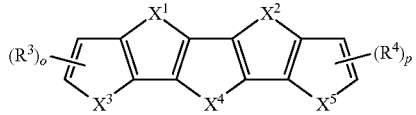

In the above Chemical Formula 1,
$X^1$ may be —$NR^1$—, —S—, —O—, or —$S(O)_2$—,
$X^2$ may be —$NR^2$—, —S—, —O—, or —$S(O)_2$—,
$X^3$ to $X^5$ may be independently -S—, —O—, or —$S(O)_2$—,
$R^1$ to $R^4$ may be independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or a combination thereof, and o and p may be independently integers ranging from 0 to 2.

The $X^1$ may be —$NR^1$—.
The $X^2$ may be —$NR^2$—.
The $X^3$ to $X^5$ may be independently —S—.
The $R^1$ and $R^2$ may be independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or a combination thereof.

The $R^1$ and $R^2$ may be independently a substituted or unsubstituted C6 to C30 aryl group.

The $R^1$ and $R^2$ may be independently a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group.

At least one of the $R^3$ and $R^4$ may be a substituted or unsubstituted C1 to C30 amine group. For example, $R^3$ may be a substituted or unsubstituted C1 to C30 amine group, $R^4$ may be a substituted or unsubstituted C1 to C30 amine group, and/or both $R^3$ and $R^4$ may be a substituted or unsubstituted C1 to C30 amine group.

At least one of the $R^3$ and $R^4$ may be a C1 to C30 amine group substituted with an aryl group.

In the C1 to C30 amine group substituted with an aryl group, the aryl group may be a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group.

The compound represented by the above Chemical Formula 1 may be represented by the following Chemical Formula 2.

[Chemical Formula 2]

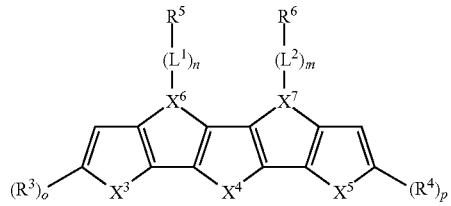

In the above Chemical Formula 2,
$X^6$ and $X^7$ may be N, $X^3$ to $X^5$ may be independently —S—, —O—, or —S(O)$_2$—, $R^3$ and $R^6$ may be independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or a combination thereof, at least one of $R^3$ and $R^4$ may be a substituted or unsubstituted C1 to C30 amine group, $L^1$ or $L^2$ may be independently a substituted or unsubstituted C1 to C30 alkylene group, a substituted or unsubstituted C6 to C30 arylene group, a substituted or unsubstituted C2 to C30 heteroarylene group, or combination thereof, and m, n, o and p may be independently integers of 0 to 2.

The $L^1$ and $L^2$ may be independently a substituted or unsubstituted C6 to C30 arylene group.

The compound represented by the above Chemical Formula 1 may be represented by one of the following Chemical Formulae 3 to 58.

Another embodiment provides an organic light emitting diode device includes an anode, a cathode, and an organic layer interposed between the anode and the cathode, wherein the organic layer includes the compound according to the above embodiment.

The organic layer may be an electron injection layer (EIL), an electron transport layer (ETL), a hole injection layer (HIL), a hole transport layer (HTL), or an emission layer.

The organic layer may be an electron injection layer (EIL) or an electron transport layer (ETL).

The electron transport layer (ETL) may include an electron transporting organic material and a metal-containing material.

The metal-containing material may include a Li complex.

The organic layer may be an emission layer.

The compound may be used as a host in the emission layer.

The organic layer may be a hole injection layer (HIL) or a hole transport layer (HTL).

Yet another embodiment provides a display device including the organic light emitting diode device according to the above embodiment.

Other embodiments are described in the detailed description.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
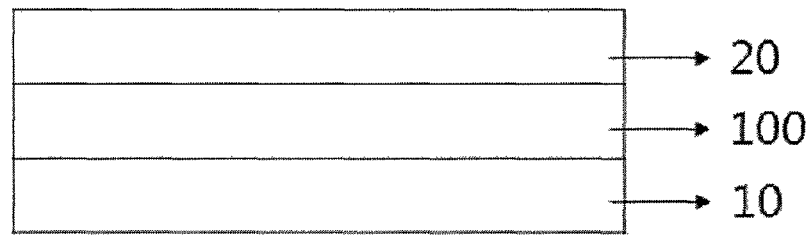
FIGS. 1 to 3 illustrate structures of organic light emitting diode devices according to various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, the term "substituted" refers to one substituted with a substituent selected from deuterium, a C1 to C30 alkyl group, a C6 to C30 aryl group, a C2 to C30 heteroaryl group, a C1 to C30 alkoxy group, a C2 to C30 alkenyl group, a C6 to C30 aryloxy group, a C1 to C30 silyloxy group, a C1 to C30 acyl group, a C2 to C30 acyloxy group, a C2 to C30 heteroaryloxy group, a C1 to C30 sulfonyl group, a C1 to C30 alkylthiol group, a C6 to C30 arylthiol group, a C1 to C30 heterocyclothiol group, a C1 to C30 phosphoric acid amide group, a C3 to C30 silyl group, NRR' (wherein, R and R' are independently a substituent selected from hydrogen, a C1 to C30 alkyl group and a C6 to C30 aryl group), a carboxyl group, a halogen, a cyano group, a nitro group, an azo group, a fluorene group and a hydroxy group, instead of at least one hydrogen.

Two adjacent substituents of the substituted C1 to C30 alkyl group, C6 to C30 aryl group, C2 to C30 heteroaryl group, C1 to C30 alkoxy group, C2 to C30 alkenyl group, C6 to C30 aryloxy group, C1 to C30 silyloxy group, C1 to C30 acyl group, C2 to C30 acyloxy group, C2 to C30 heteroaryloxy group, C1 to C30 sulfonyl group, C1 to C30 alkylthiol group, C6 to C30 arylthiol group, C1 to C30 heterocyclothiol group, C1 to C30 phosphoric acidamide group, C3 to C30 silyl group, NRR' (wherein, R and R' are independently a substituent selected from hydrogen, a C1 to C30 alkyl group and a C6 to C30 aryl group), carboxyl group, halogen, cyano group, nitro group, azo group, fluorene group, or hydroxy group may be fused to provide a ring.

As used herein, when a definition is not otherwise provided, the term "hetero" refers to 1 to 3 heteroatoms selected from B, N, O, S, and P and remaining carbon in one ring.

As used herein, when a definition is not otherwise provided, the "combination thereof" refers to two or more substituents linked by a linking group, or two or more substituents condensed with each other.

As used herein, the "organic layer" may refer to a layer including an organic material, but the organic layer is not a layer consisting of an organic material, may include an inorganic material, a metal complex, and the like as well as an organic material, and may include at least one layer.

Representative groups in the chemical formulae are defined as follows (carbon numbers of substituents are not limited and do not limit characteristics of substituents).

The unsubstituted C1 to C30 alkyl group may be linear and branched, and non-limiting examples thereof may be methyl, ethyl, propyl, isobutyl, sec-butyl, pentyl, iso-amyl, hexyl, heptyl, octyl, nonyl, dodecyl, and the like.

The unsubstituted C2 to C30 alkenyl group may have at least one carbon double bond in the middle or terminal end of the unsubstituted alkyl group. Examples thereof may be ethenyl, propenyl, butenyl, and the like.

The unsubstituted C2 to C30 alkynyl group may have at least one carbon triple bond in the middle or terminal end of the unsubstituted alkyl group. Examples thereof may be acetylene, propyne, phenylacetylene, naphthylacetylene, isopropylacetylene, t-butylacetylene, diphenylacetylene, and the like.

The unsubstituted C3 to C30 cycloalkyl group may refer to a cyclic alkyl group having 3 to 30 carbon numbers.

The unsubstituted C1 to C30 alkoxy group may refer to —OA (wherein, A is the above-described unsubstituted C1 to C30, and non-limiting examples may be methoxy, ethoxy, propoxy, isopropyloxy, butoxy, pentoxy, and the like.

The unsubstituted C6 to C30 aryl group may refer to a carbocycle aromatic system having at least one ring. The aryl group may have two or more rings, which may be fused or linked through a single bond and the like. The term aryl may include an aromatic system such as phenyl, naphthyl, anthracenyl, and the like. The unsubstituted C6 to C30 aryl group may be selected from a phenyl group, a tolyl group, a naphthyl group, an anthracenyl group, a terphenyl group, a phenanthrenyl group, a pyrenyl group, a diphenylanthracenyl group, a dinaphthylanthracenyl group, a pentacenyl group, a bromophenyl group, a hydroxyphenyl group, a stilbene group, an azobenzenyl group, and a ferrocenyl group.

The unsubstituted C2 to C30 heteroaryl group may include 1, 2 or 3 heteroatoms selected from N, O, S, and P. The heteroaryl group may have two or more rings, which may be fused or linked through a single bond and the like. Examples of the unsubstituted C2 to C30 heteroaryl group may be selected from a pyrazolyl group, an imidazolyl group, an oxazolyl group, a thiazolyl group, a triazinyl group, a triazolyl group, a tetrazolyl group, an oxadiazolyl group, a thiadiazolyl group, a pyridinyl group, a pyridazinyl group, a pyrimidinyl group, a triazinyl group, a carbazolyl group, an indolyl group, a quinolinyl group, an isoquinolinyl group, a thiophene group, a dibenzothiophene group, a dibenzofuran group, and a benzimidazolyl group.

The unsubstituted C6 to C30 aryloxy group may refer to —OA$^1$, wherein A$_1$ is the same functional group as the C6 to C30 aryl group except carbon numbers. Examples of the aryloxy group may include a phenoxy group, and the like.

The unsubstituted C6 to C30 arylthio group may refer to —SA$^1$, wherein A$^1$ is the same functional group as the C6 to C30 aryl group except carbon numbers. Examples of the arylthio group may include a benzenethio group, a naphthylthio group, and the like.

An organic compound according to an embodiment may be represented by the following Chemical Formula 1:

[Chemical Formula 1]

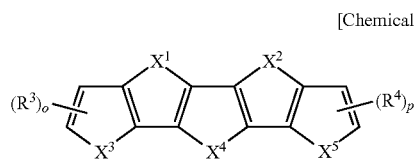

In the above Chemical Formula 1,
$X^1$ may be —NR$^1$—, —S—, —O—, or —S(O)$_2$—,
$X^2$ may be —NR$^2$—, —S—, —O—, or —S(O)$_2$—,
$X^3$ to $X^5$ may be each independently —S—, —O—, or —S(O)$_2$—,
$R^1$ to $R^4$ may be each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthio group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or a combination thereof, and o and p may be each independently integers of 0 to 2.

In an implementation, o and p may be each independently 0 or 1.

In an implementation, $X^1$ may be —NR$^1$—, $X^2$ may be —NR$^2$—, $X^3$ to $X^5$ may each be —S—, and $R^1$ and $R^2$ may be each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthio group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or a combination thereof.

The compound according to an embodiment may be a condensed compound of, e.g., thiophene, pyrrole, or furan, and may be applicable to, e.g., a light emitting material, an electron transport layer (ETL) material, or a hole transport layer (HTL) material of an organic light emitting diode device.

In an implementation, $R^1$ and $R^2$ may be each independently a substituted or unsubstituted C6 to C30 aryl group. For example, the $R^1$ and $R^2$ may be each independently a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group. For example, each aryl group having electrical characteristics different from each other may be used to help control characteristics of a material for appropriate purposes, and may be linked to another aryl group to have additional characteristics.

In the compound according to an embodiment, at least one of $R^3$ and $R^4$ may be a substituted or unsubstituted C1 to C30 amine group. For example, an amine group may be linked to a thiophene ring, and electrical balance of the thiophene ring may be optimized.

In an implementation, at least one of $R^3$ and $R^4$ may be a C1 to C30 amine group substituted with an aryl group. The aryl group may be, e.g., a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group.

In an implementation, the compound represented by Chemical Formula 1 may be represented by the following Chemical Formula 2.

[Chemical Formula 2]

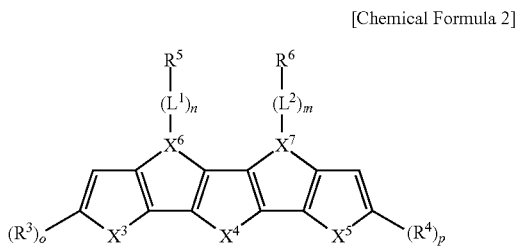

In Chemical Formula 2, $X^6$ and $X^7$ may be N, $X^3$ to $X^5$ may be each independently —S—, —O—, or —S(O)$_2$—, and $R^3$ to $R^6$ may be each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or combination thereof.

At least one of $R^3$ and $R^4$ may be a substituted or unsubstituted C1 to C30 amine group.

$L^1$ and $L^2$ may be each independently a substituted or unsubstituted C1 to C30 alkylene group, a substituted or unsubstituted C6 to C30 arylene group, a substituted or unsubstituted C2 to C30 heteroarylene group, or combination thereof, and m, n, o and p may be each independently integers of 0 to 2.

For example, $L^1$ and $L^2$ may be each independently a substituted or unsubstituted C6 to C30 arylene group.

The compounds represented by Chemical Formula 1 or Chemical Formula 2 may have various substituents and thus may have various energy bandgaps.

The compound may have an appropriate energy level depending on the substituents and thus, may help fortify hole transport capability or electron transport capability of an organic optoelectronic device and bring about excellent effects on efficiency and driving voltage and also, may have excellent electrochemical and thermal stability and thus, improve life-span characteristics during the operation of the organic optoelectronic device.

In an implementation, in Chemical Formula 2, $X^6$ and $X^7$ may be N, and all of $X^3$ to $X^5$ may be —S—.

Each thiophene, pyrrole, and furan may have improved electronic, electrical performance, and thus the compound represented by Chemical Formula 1 (including condensed thiophene and/or pyrrole) may have improved hole characteristics and electron characteristics.

Hole characteristics refer to characteristics that hole formed in the anode is easily injected into the emission layer and transported in the emission layer due to conductive characteristics according to HOMO level. For example, it may be similar to electron-repelling characteristics.

Electron characteristics may refer to characteristics that electron formed in the cathode is easily injected into the emission layer and transported in the emission layer due to conductive characteristics according to LUMO level. For example, it may be similar to electron-withdrawing characteristics.

In an implementation, $R^5$ and $R^6$ may be each independently a substituted or unsubstituted C6 to C30 aryl group. For example, $R^5$ and $R^6$ may be each independently a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group. In an implementation, in the above Chemical Formula 2, when n and m are 0, an aryl group may be directly linked to a nitrogen atom (N) of a pyrrole ring, and electrical balance of the pyrrole ring may be optimized and thus, hole and/or electron characteristics of the compound represented by Chemical Formula 2 may be appropriately adjusted.

In an implementation, $L^1$ and $L^2$ may be each independently a substituted or unsubstituted C6 to C30 arylene group. In an implementation, in Chemical Formula 2, when n or m is an integer of 1 or 2, an arylene group may be directly linked to a nitrogen atom (N) of a pyrrole ring and electrical balance of the pyrrole ring may be optimized and thus, hole and/or electron characteristics of the compound represented by Chemical Formula 2 may be appropriately adjusted.

In an implementation, $L^1$ and $L^2$ may be selectively adjusted to determine the entire conjugation length of the compound, which may adjust the triplet energy bandgap of the compound. Accordingly, characteristics of a material required of an organic light emitting diode device may be realized. In an implementation, the triplet energy bandgap may be adjusted by changing bonding positions of ortho, para, and meta.

Examples of $L^1$ and $L^2$ may include a substituted or unsubstituted phenylene group, a substituted or unsubstituted biphenylene group, a substituted or unsubstituted terphenylene group, a substituted or unsubstituted naphthylene group, a substituted or unsubstituted anthracenylene group, a substituted or unsubstituted phenanthrylene group, a substituted or unsubstituted pyrenylene group, a substituted or unsubstituted fluorenylene group, a substituted or unsubstituted p-terphenyl group, a substituted or unsubstituted m-terphenyl group, a substituted or unsubstituted perylenyl group, and the like.

Examples of the compound according to an embodiment may be as follows. The compound may be represented by one of the following Chemical Formulae 3 to 58, or a mixture of at least two or more Chemical Formulae, or may be mixed with other compounds.

[Chemical Formula 3]

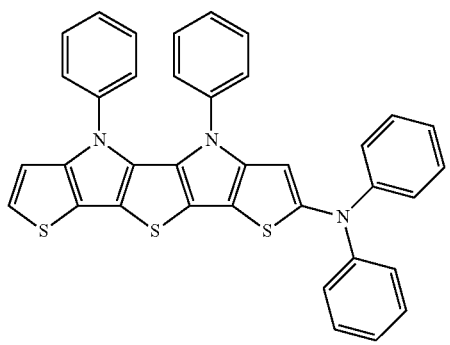 [SMILES: c1ccc(N(c2ccccc2)c2cc3c(s2)c2sc4c5sccc5n(-c5ccccc5)c4c2n3-c2ccccc2)cc1]

[Chemical Formula 4]
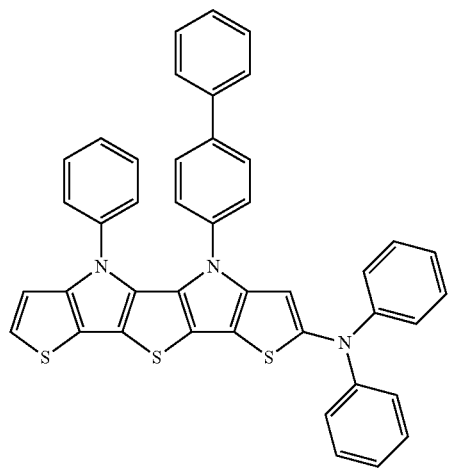
[Chemical Formula 5]
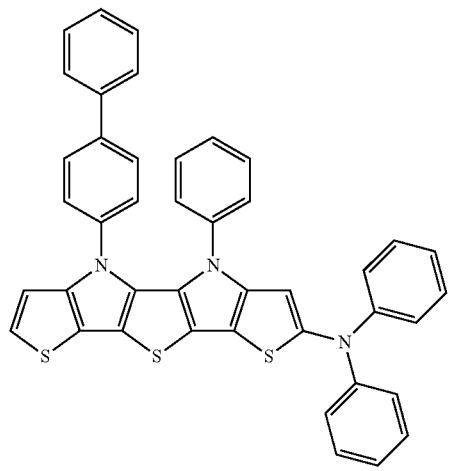
[Chemical Formula 6]
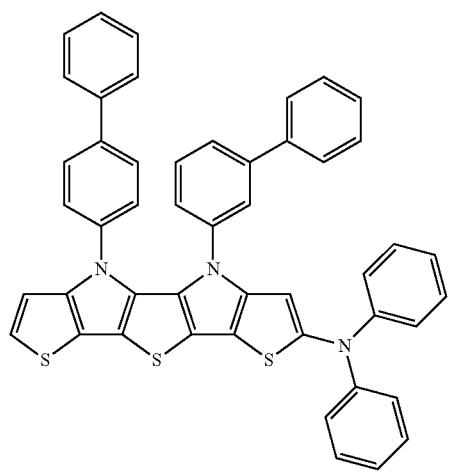
[Chemical Formula 7]
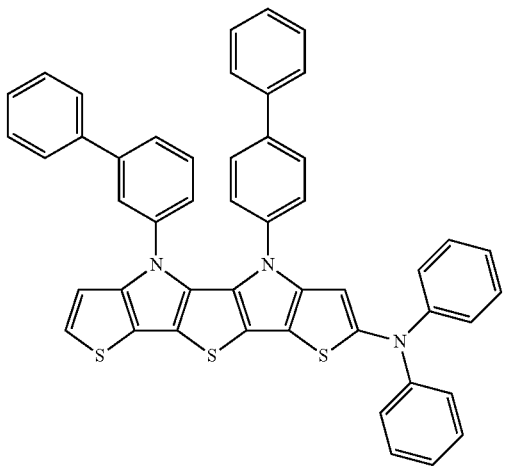
[Chemical Formula 8]
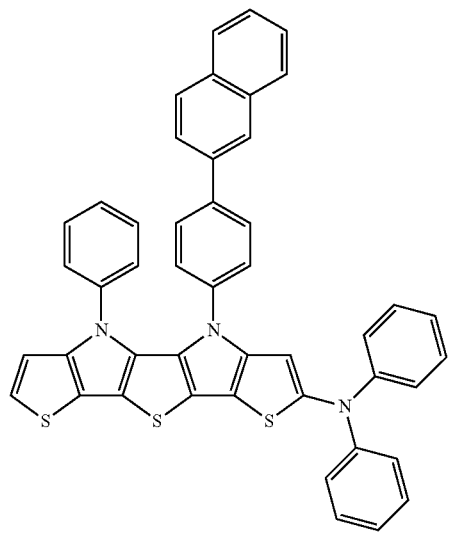
[Chemical Formula 9]
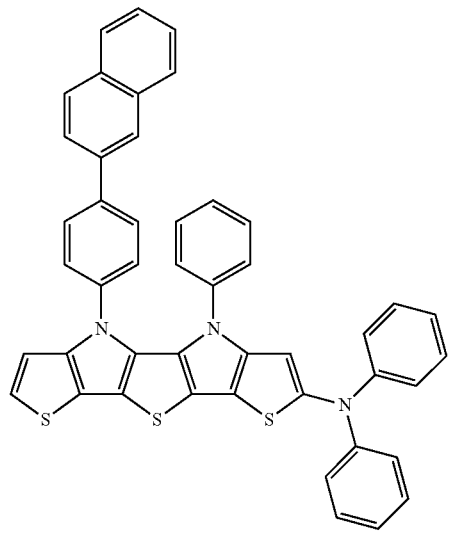

[Chemical Formula 10]
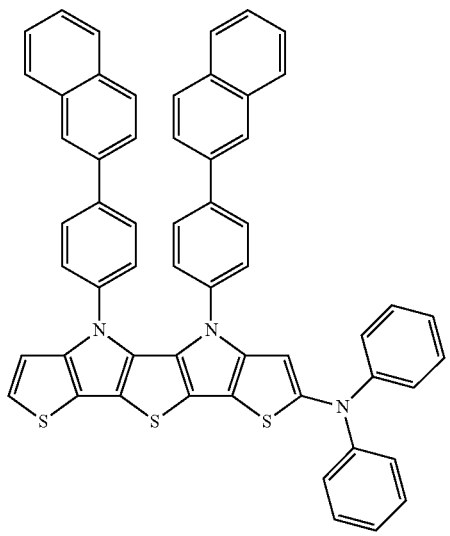
[Chemical Formula 11]
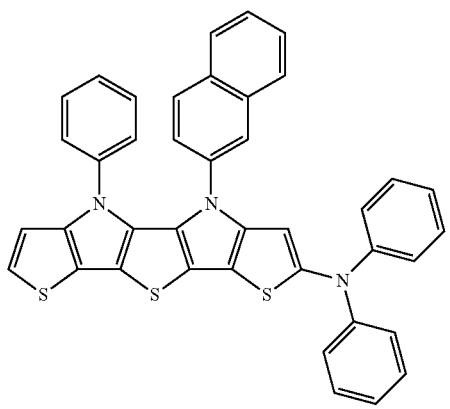
[Chemical Formula 12]
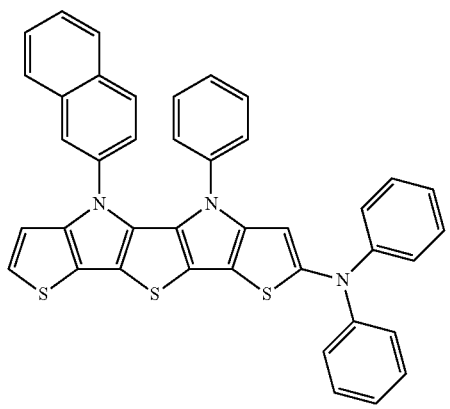
[Chemical Formula 13]
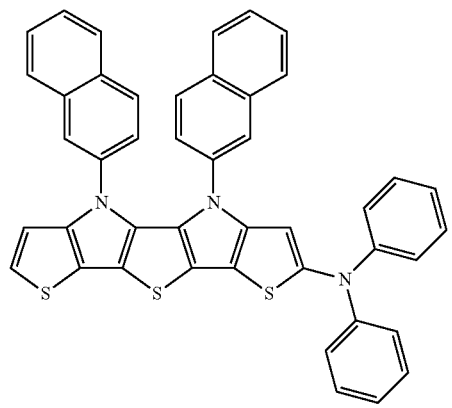
[Chemical Formula 14]
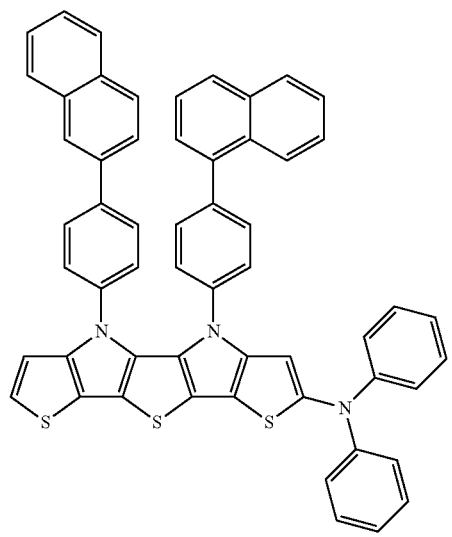
[Chemical Formula 15]
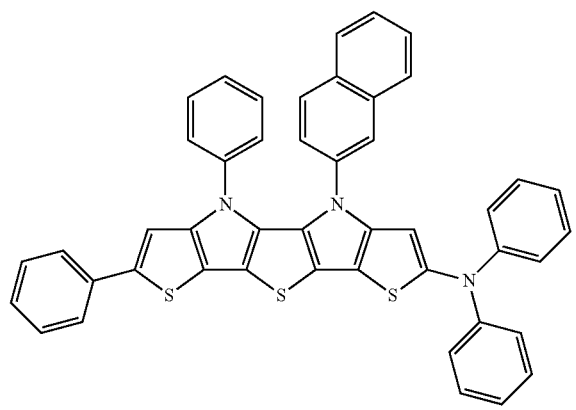

[Chemical Formula 16]
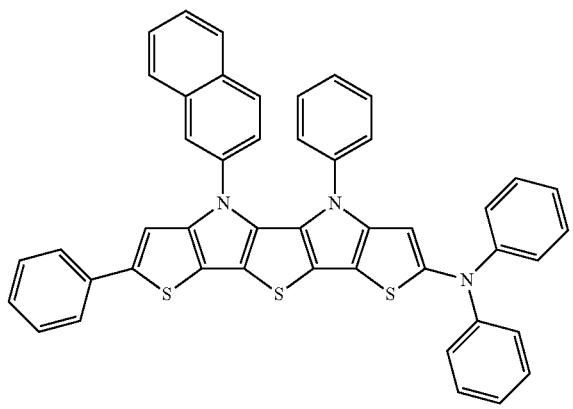
[Chemical Formula 17]
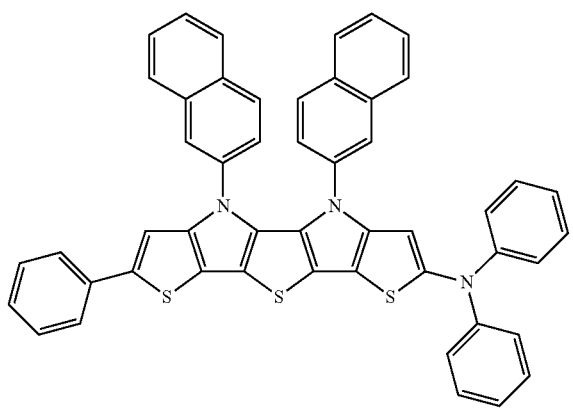
[Chemical Formula 18]
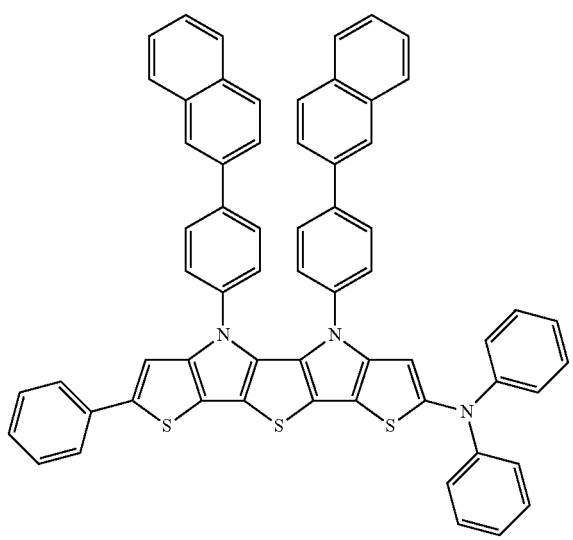
[Chemical Formula 19]
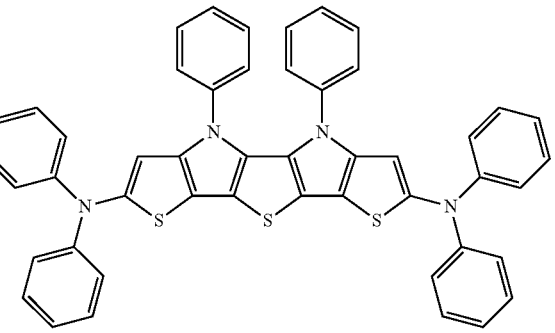
[Chemical Formula 20]
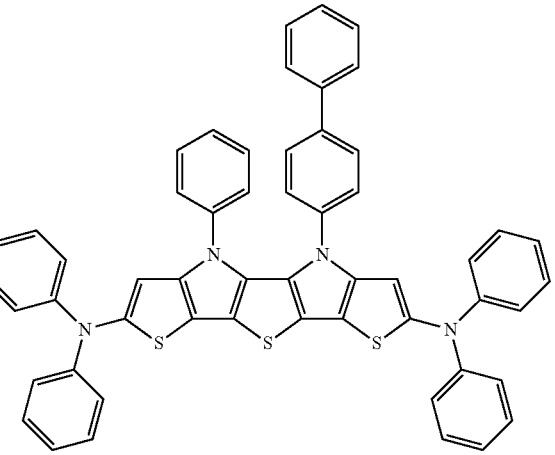
[Chemical Formula 21]
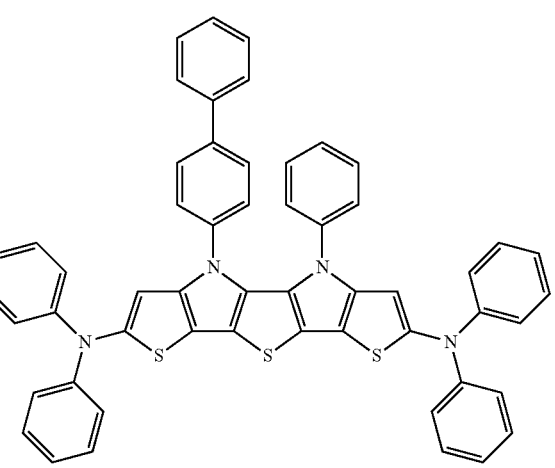

[Chemical Formula 22]
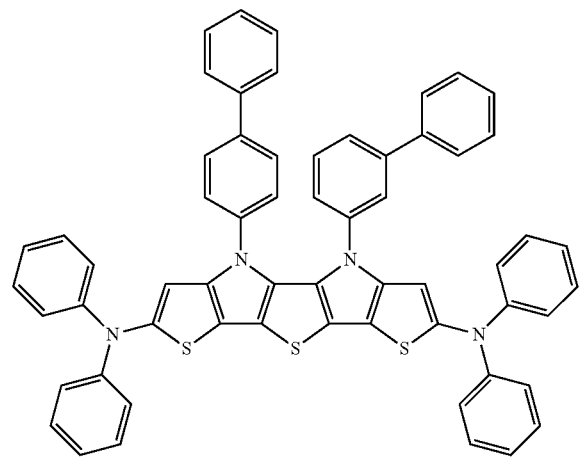
[Chemical Formula 23]
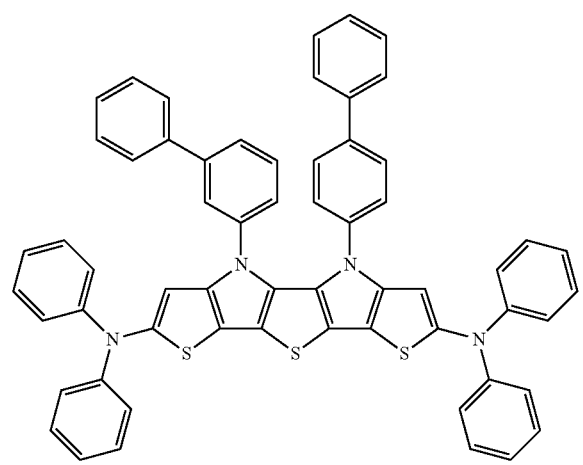
[Chemical Formula 24]
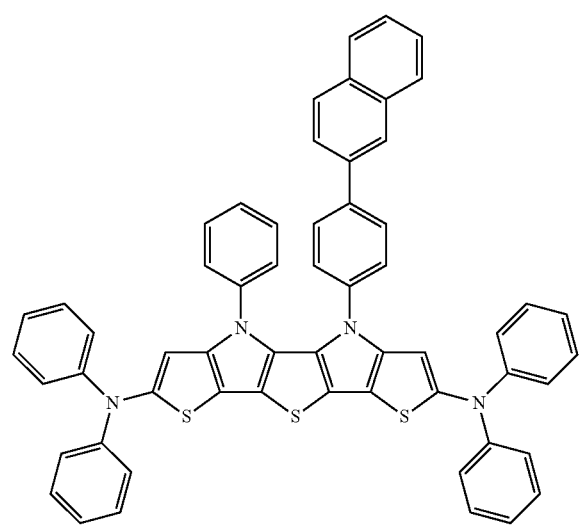
[Chemical Formula 25]
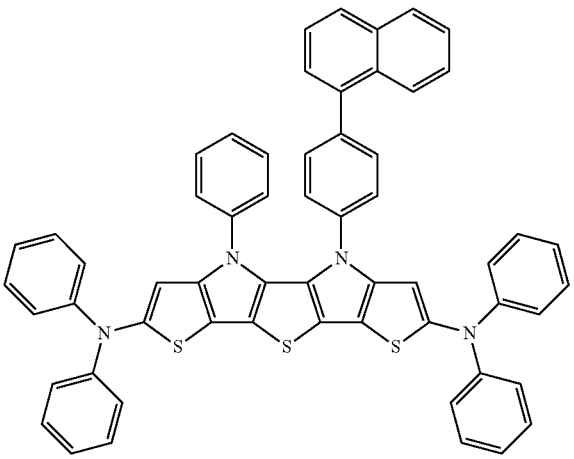
[Chemical Formula 26]
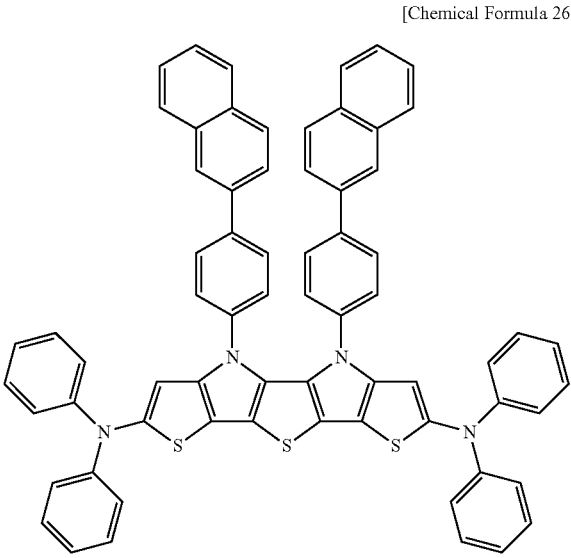
[Chemical Formula 27]
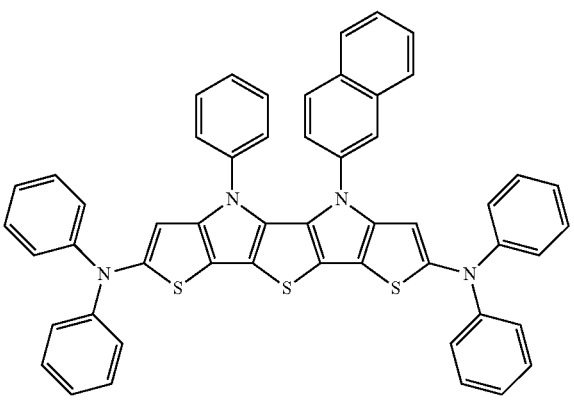

[Chemical Formula 28]
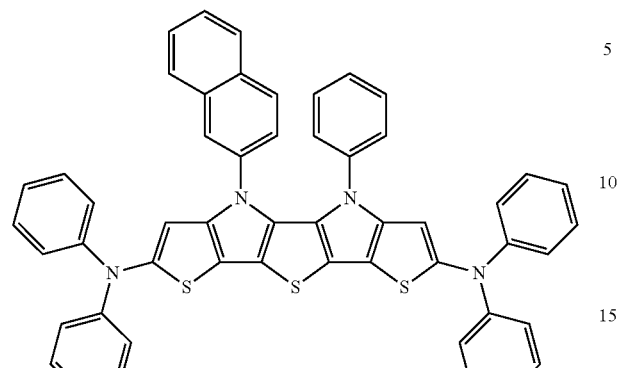
[Chemical Formula 29]
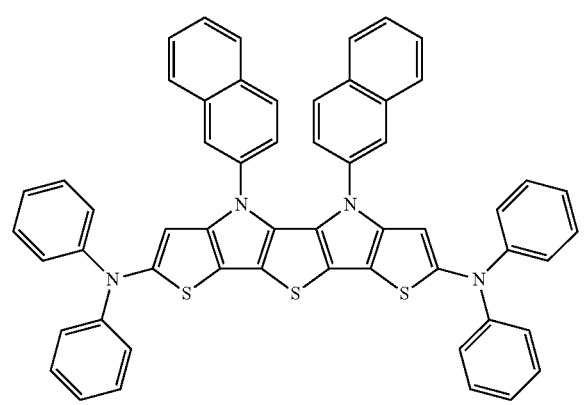
[Chemical Formula 30]
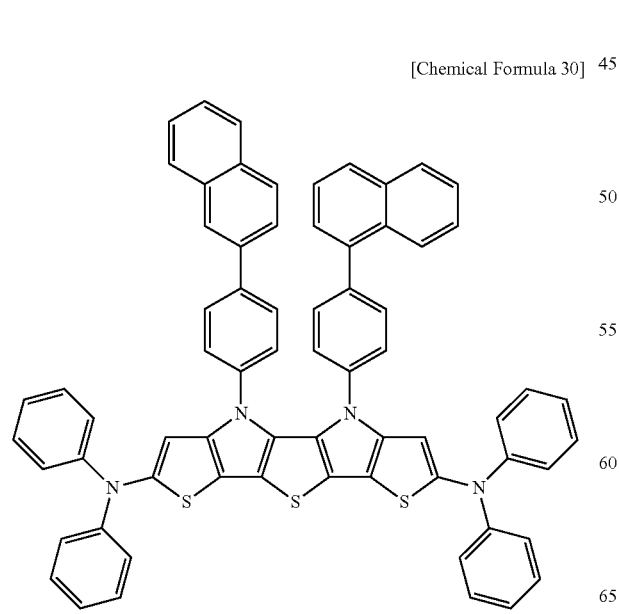
[Chemical Formula 31]
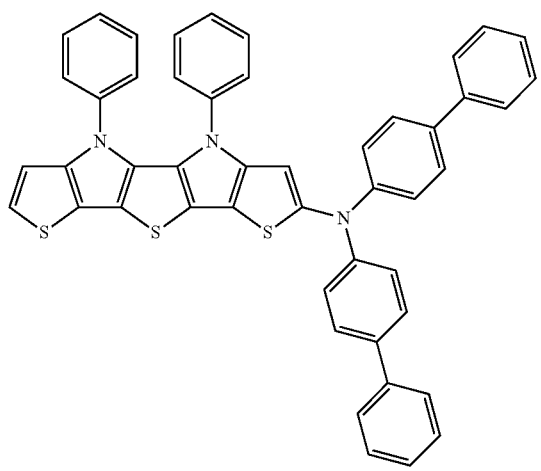
[Chemical Formula 32]
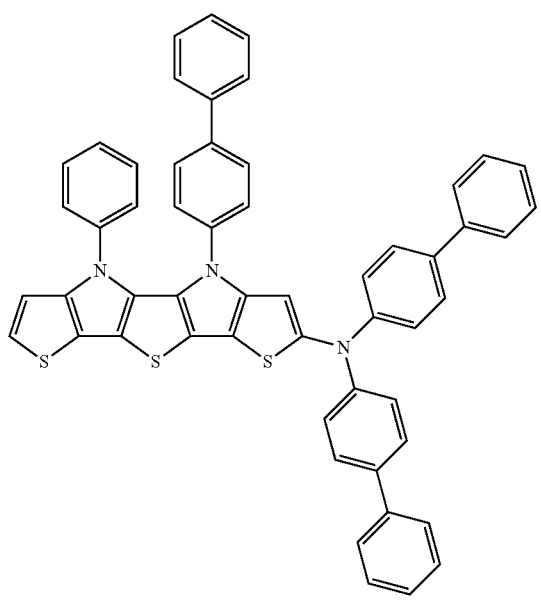

[Chemical Formula 33]
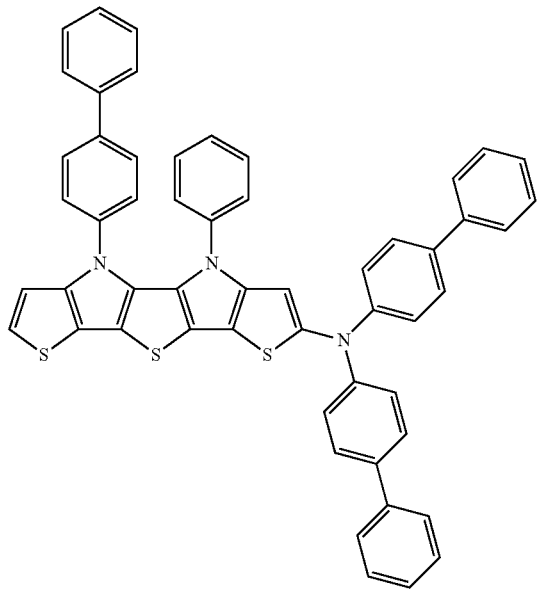
[Chemical Formula 34]
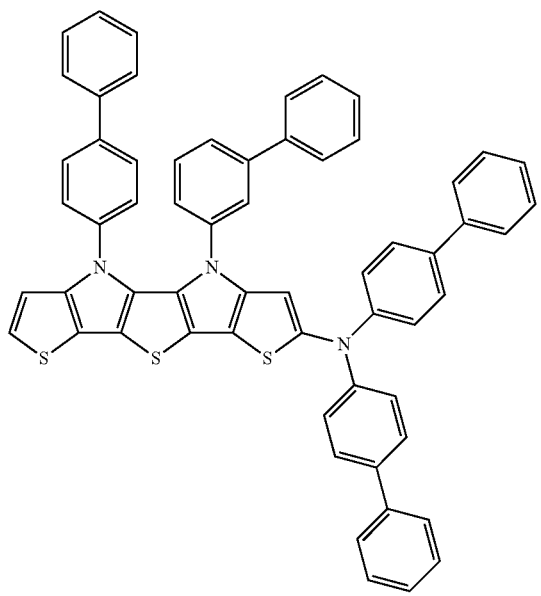
[Chemical Formula 35]
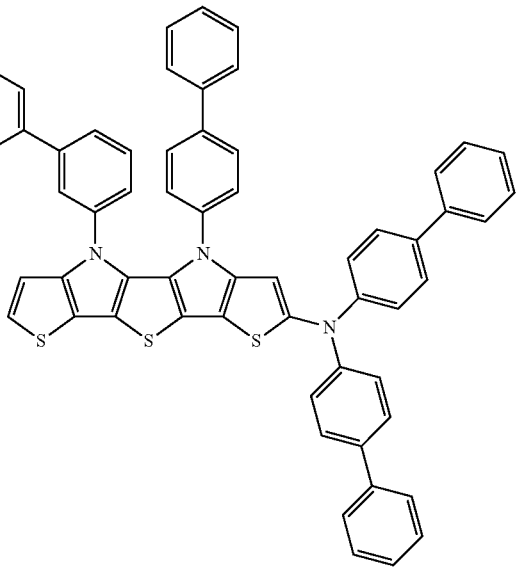
[Chemical Formula 36]
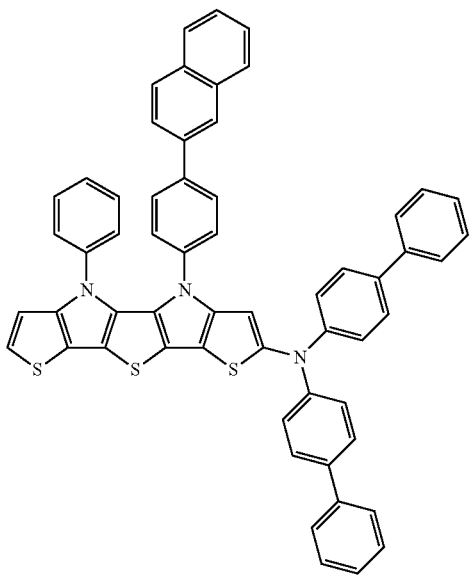

[Chemical Formula 37]
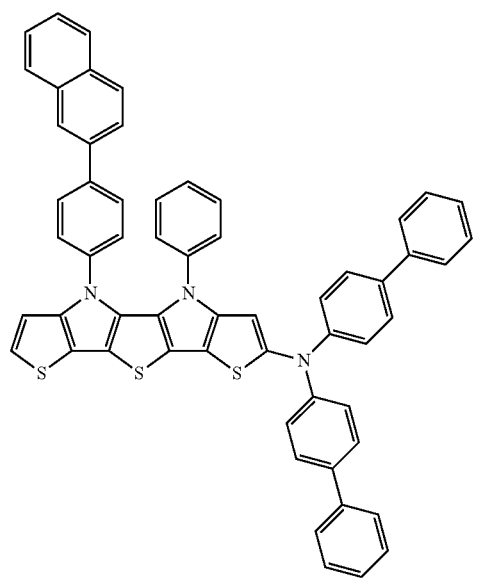
[Chemical Formula 38]
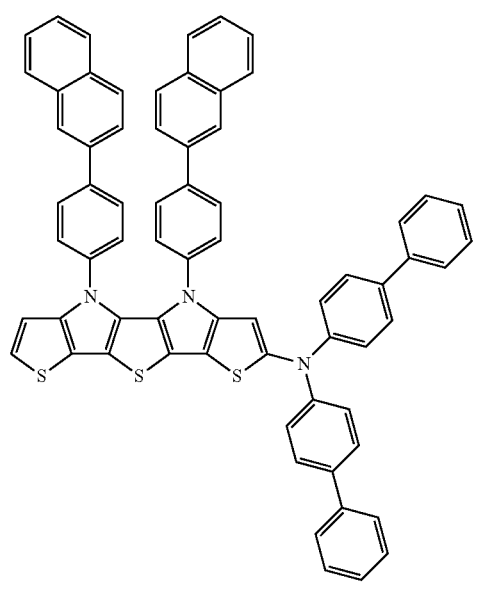
[Chemical Formula 39]
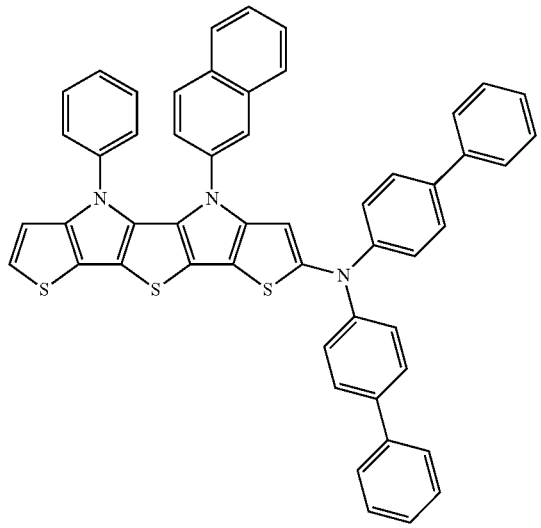
[Chemical Formula 40]
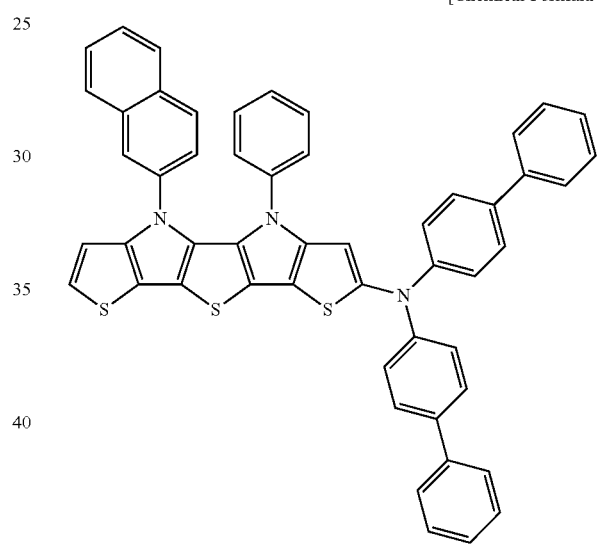
[Chemical Formula 41]
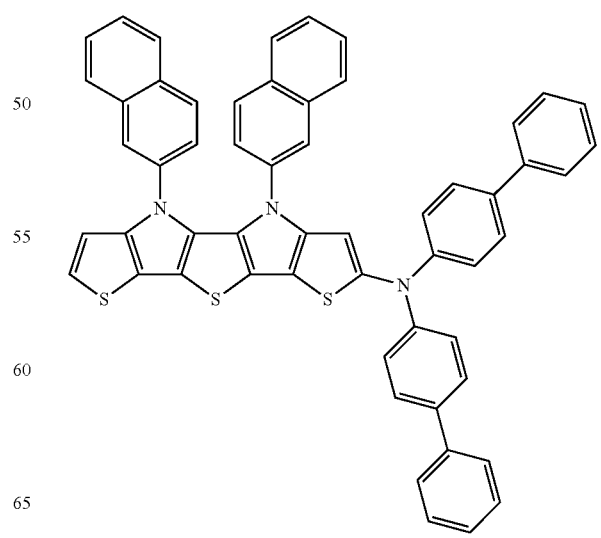

[Chemical Formula 42]
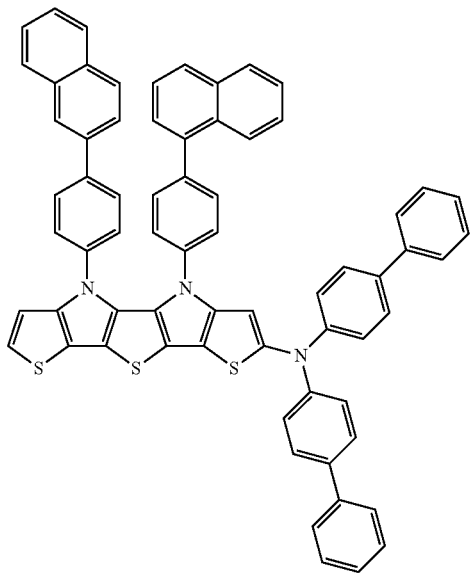
[Chemical Formula 43]
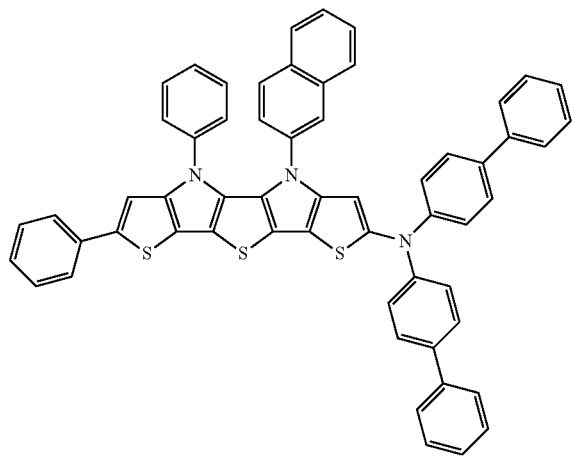
[Chemical Formula 44]
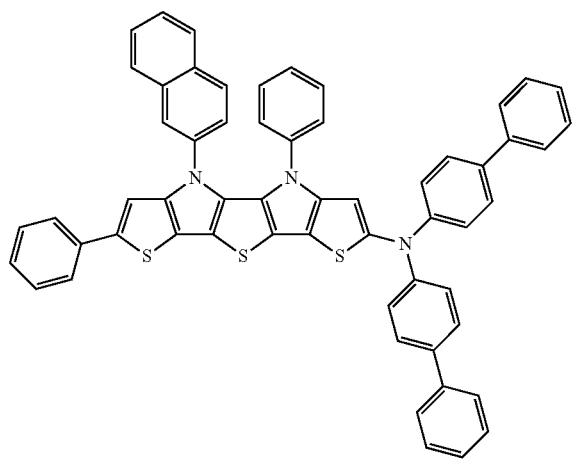
[Chemical Formula 45]
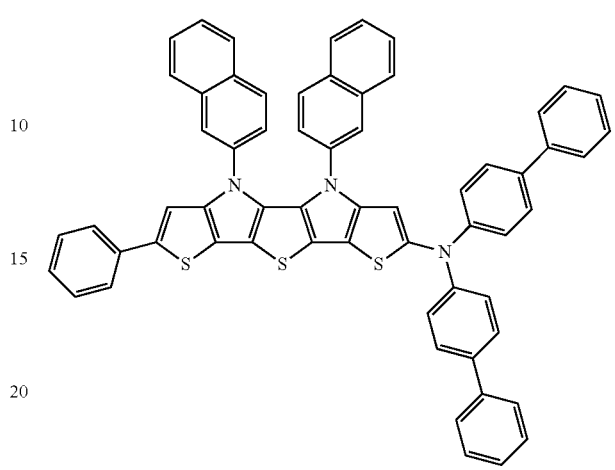
[Chemical Formula 46]
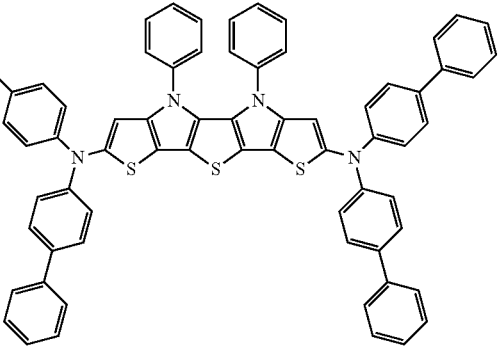
[Chemical Formula 47]

[Chemical Formula 48]
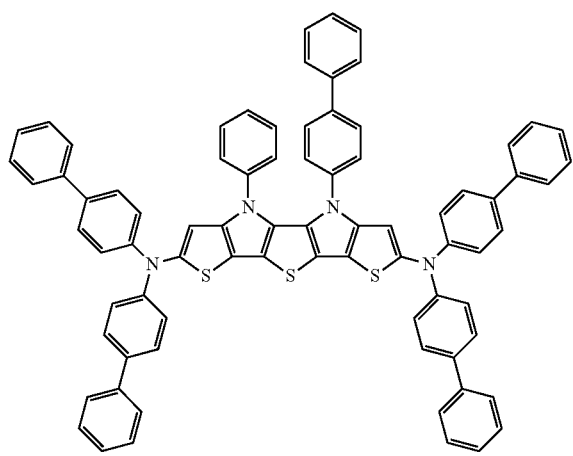
[Chemical Formula 49]
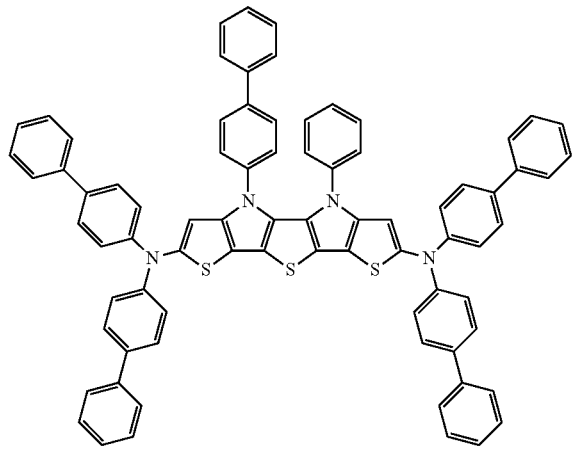
[Chemical Formula 50]
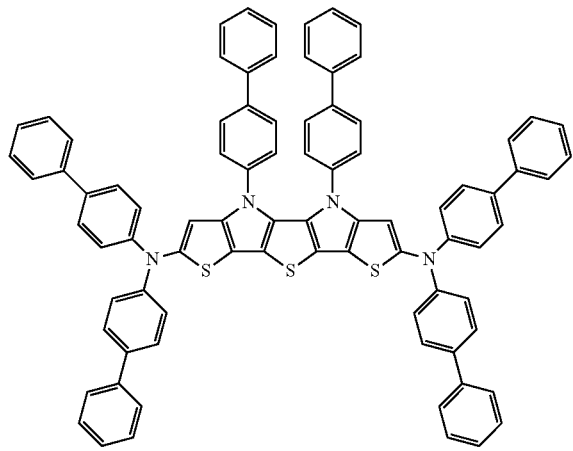
[Chemical Formula 51]
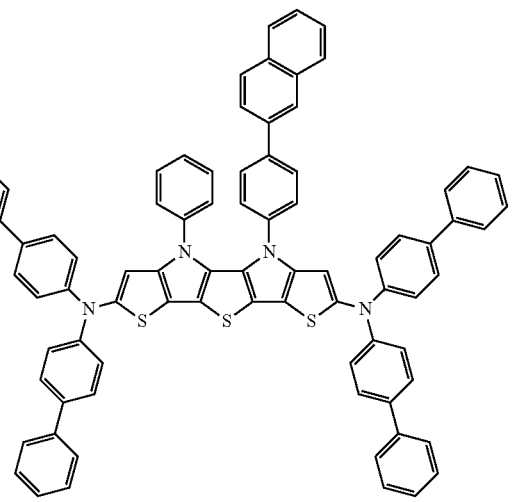
[Chemical Formula 52]
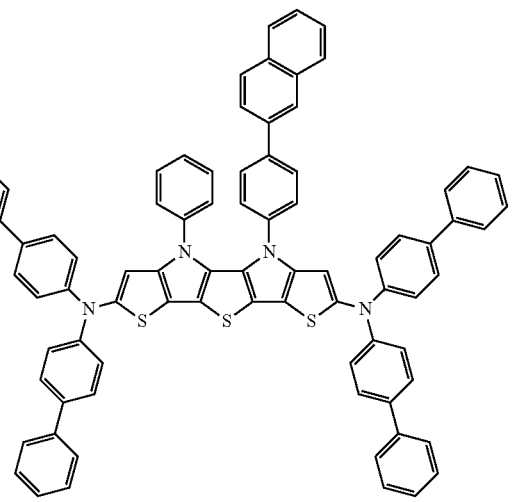
[Chemical Formula 53]
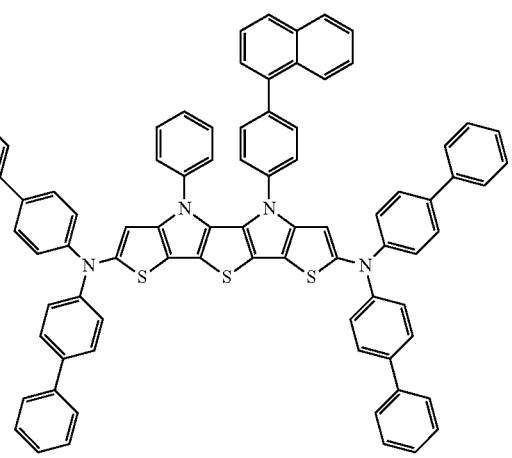

[Chemical Formula 54]

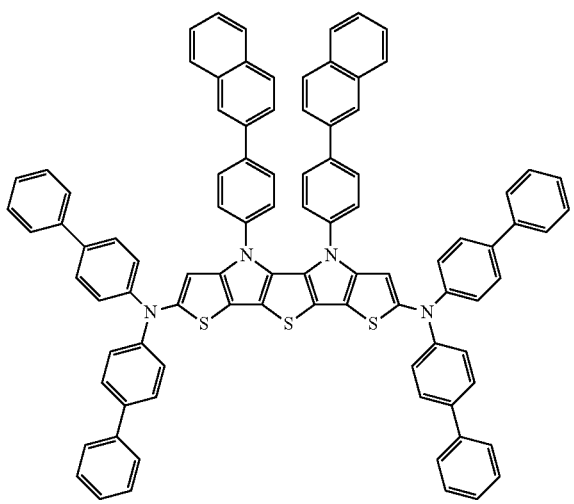

[Chemical Formula 55]

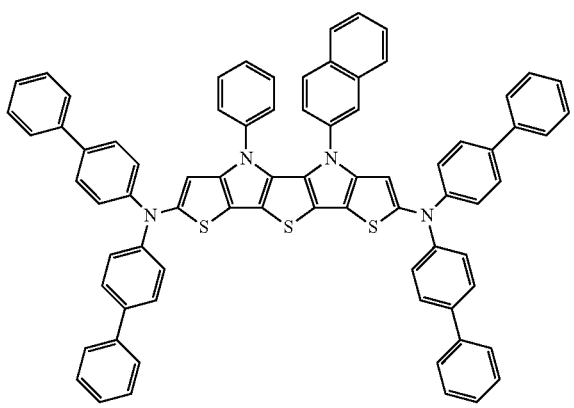

[Chemical Formula 56]

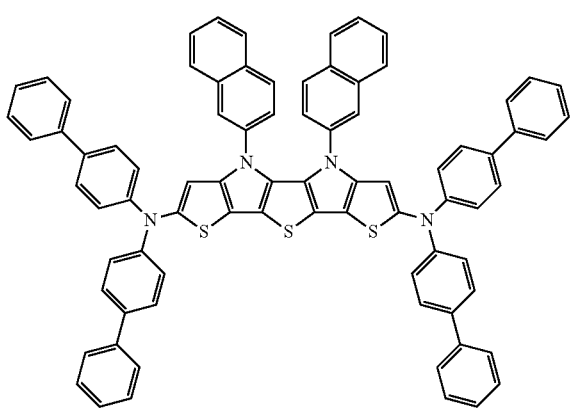

[Chemical Formula 57]

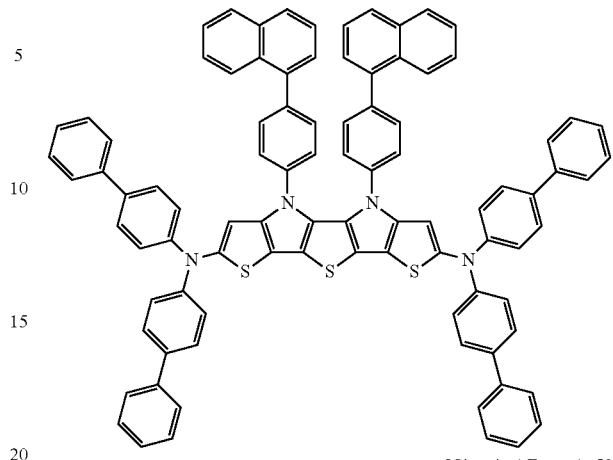

[Chemical Formula 58]

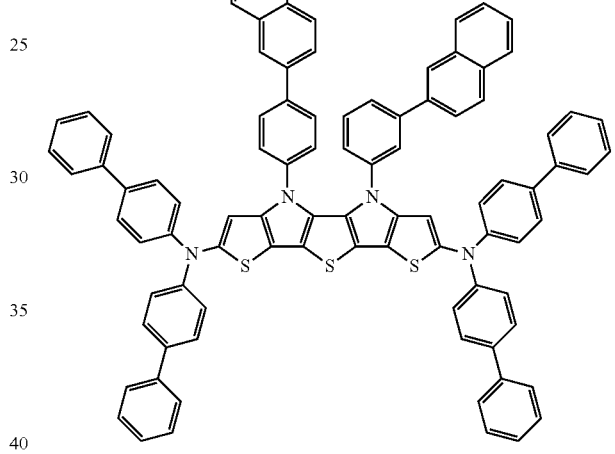

Hereinafter, an organic light emitting diode device according to an embodiment and including the organic compound is described referring to FIGS. 1 to 3.

Figure 2:
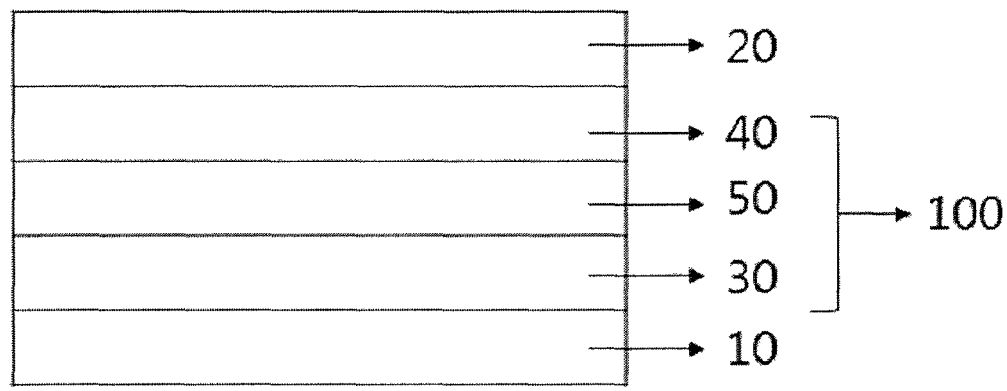
Figure 3:
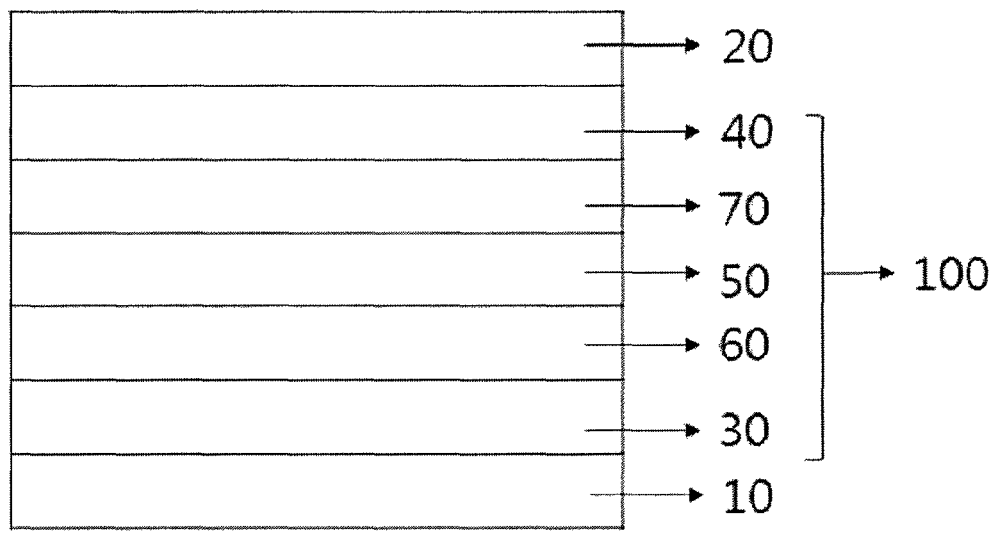

FIGS. 1 to 3 illustrate cross-sectional views of organic light emitting diode devices according to various embodiments.

Referring to FIG. 1, an organic light emitting diode device according to an embodiment may include an anode 10, a cathode 20 facing the anode 10, and an organic layer 100 between the anode 10 and the cathode 20.

The organic layer 100 may include the compound according to an embodiment.

The organic layer 10 may be formed by, e.g., various methods such as vacuum deposition, a spin coating method, a casting method, a LB method, or the like.

When the organic layer is formed by the vacuum deposition, the deposition conditions may be different according to the compound used as the material for the organic layer, the structure of the desired organic layer, and thermal characteristics, e.g., may be appropriately selected within the ranges of deposit temperature of about 100 to about 500° C., the vacuum degree of about $10^{-8}$ to about $10^{-3}$ torr, and the deposition rate of about 0.01 to about 100 Å/sec.

When the organic layer is formed by the spin coating, the coating conditions may be different according to the compound used as a material for the organic layer, the structure of the desired organic layer, and thermal characteristics or the like, e.g., may be suitably selected from the ranges of a coating speed of about 2,000 rpm to about 5,000 rpm, a heat treatment temperature of about 80° C. to about 200° C. for removing the solvent after coating.

The substrate (not shown) may be disposed on the side of anode 10 or on the side of cathode 20. The substrate may be made of, e.g., an inorganic material such as glass or an organic material such as polycarbonate, polymethylmethacrylate, polyethyleneterephthalate, polyethylenenaphthalate, polyamide, polyethersulfone, or a combination thereof, silicon wafer, or the like.

The anode 10 may be a transparent electrode or an opaque electrode. The transparent electrode may be formed of, e.g., conductive oxide such as indium tin oxide (ITO), indium zinc oxide (IZO), tin oxide ($SnO_2$), zinc oxide (ZnO), or a combination thereof, or a metal such as aluminum silver, or magnesium, in a thin thickness, and the opaque electrode may be made of, e.g., a metal such as aluminum silver, or magnesium.

The cathode 20 may include a material having a small work function, so that electrons may be easily injected thereinto. For example, the material having a small work function may include a metal such as magnesium, calcium, sodium, potassium, titanium, indium, yttrium, lithium, gadolinium, aluminum silver, tin, lead, cesium, barium, and the like or an alloy thereof, a multi-layer structure material such as LiF/Al, $LiO_2$/Al, LiF/Ca, LiF/Al, and $BaF_2$/Ca, and the like but is not limited thereto. The cathode may be a metal electrode such as aluminum or the like.

Hereinafter, an organic light emitting diode device according to an embodiment is illustrated referring to FIG. 2.

Referring to FIG. 2, an organic light emitting diode device according to an embodiment may include the anode 10 and the cathode 20, and an organic layer 100 between the anode 10 and the cathode 20, like the above embodiment. The organic layer 100 may further include an emission layer 50 between the anode 10 and the cathode 20, a hole transport layer (HTL) 30 between the anode 10 and the emission layer 50, and an electron transport layer (ETL) 40 between the cathode 20 and the emission layer 50.

The electron transport layer (ETL) 40 may include the compound according to an embodiment and thus may help increases electron mobility.

The electron transport layer (ETL) 40 may further include a metal-containing material as well as the compound according to an embodiment.

The metal-containing material may include a Li complex. Examples of the Li complex may include lithium quinolate (LiQ) or the following compound 103.

[Compound 103]

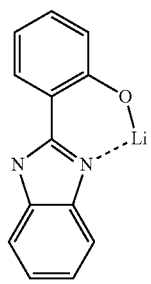

The electron transport layer (ETL) 40 may be formed by, e.g., various methods such as vacuum deposition, a spin coating method, a casting method, or the like, on the emission layer 50. When the electron transport layer (ETL) is formed by the vacuum deposition and the spin coating method, conditions thereof may be different according to the compound used.

The emission layer 50 may include only the compound according to an embodiment, or may further include another organic compound. When other organic compound is further included, the compound according to an embodiment may function as a host in the emission layer.

Examples of a red dopant may include PtOEP, Ir(piq)$_3$, Btp$_2$Ir(acac), DCJTB, and the like.

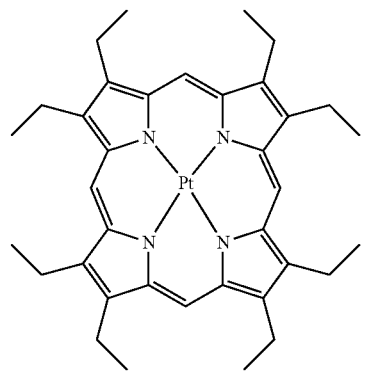

PtOEP

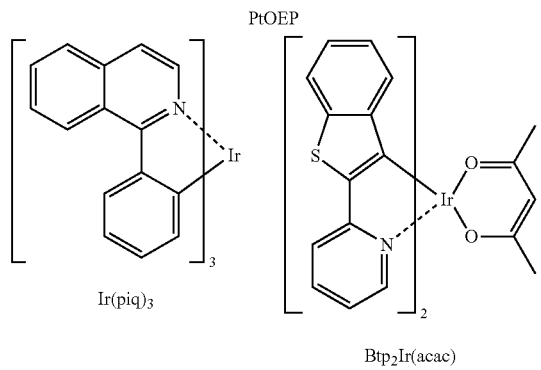

Ir(piq)$_3$     Btp$_2$Ir(acac)

Examples of a green dopant may include Ir(ppy)$_3$ (ppy=phenylpyridine), Ir(ppy)$_2$(acac), Ir(mpyp)$_3$, C545T, and the like.

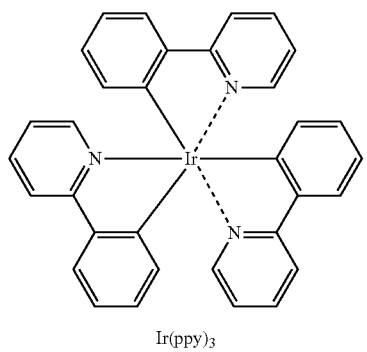

Ir(ppy)$_3$

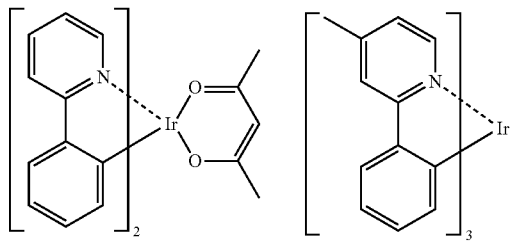
Ir(ppy)₂(acac)  Ir(mppy)₃
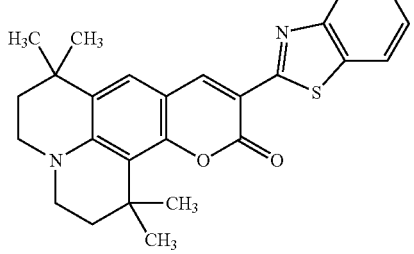
C545T
Examples of a blue dopant may include F₂Irpic, (F₂ppy)₂Ir(tmd), Ir(dfppz)₃, ter-fluorene(fluorene), 4,4'-bis(4-diphenylaminostyryl)biphenyl (DPAVBi), 2,5,8,11-tetra-ter-butyl perylene (TBP), and the like.
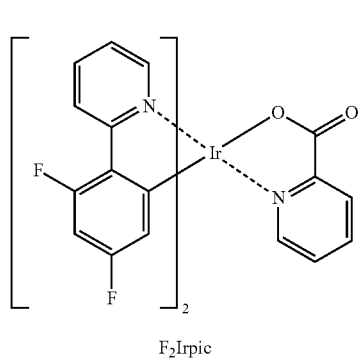
F₂Irpic
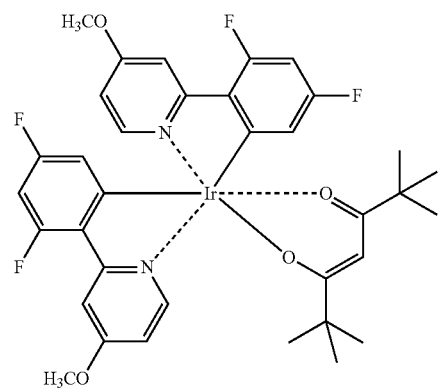
(F₂ppy)₂Ir(tmd)
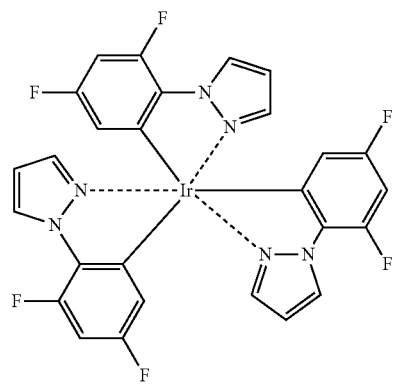
Ir(dfppz)₃
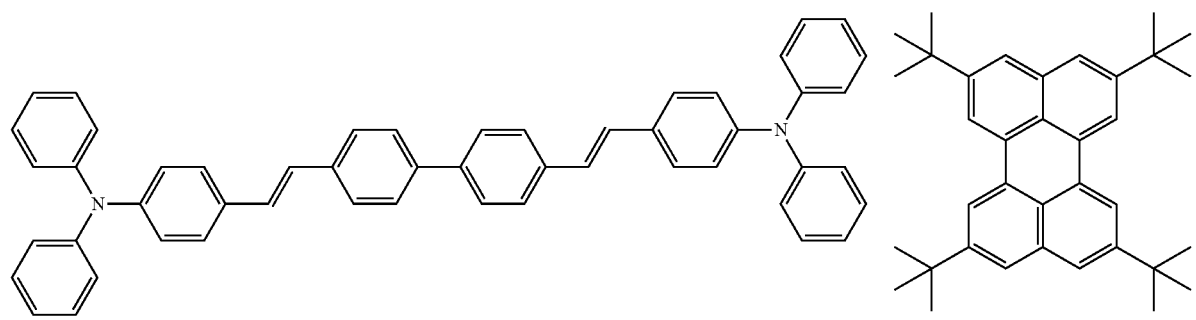
DPAVBi                TBP The dopant may be included in an amount of about 0.1 to about 15 parts by weight, based on a total weight, e.g., 100 parts by weight, of an emission layer-forming material (i.e., a total weight of the host and dopant is 100 parts by weight). Within the above range of the dopant, a concentration extinction phenomenon may be substantially suppressed.

The emission layer 50 may emit white by a combination of red, green, and blue three primary colors, and the combination of colors may be implemented by combination of adjacent sub-pixels to emit white or stack in a vertical direction to emit white.

The hole transport layer (HTL) 30 may include the above compound according to an embodiment and thus may help increase hole mobility.

The hole transport layer (HTL) 30 may further include p-dopant in order to help improve film conductivity.

Examples of the p-dopant may include a quinone derivative such as tetracyanoquinone dimethane (TCNQ) and 2,3,5,6-tetrafluoro-tetracyano-1,4-benzoquinone dimethane (F4-CTNQ), and the like, metal oxides such as tungsten oxide and molybdenum oxide, or a cyano group-containing compound such as the following compound 100.

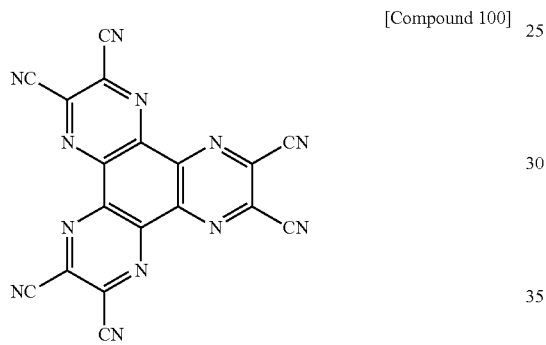

[Compound 100]

When the hole transport layer (HTL) 30 further includes the p-dopant, the p-dopant may be uniformly or non-uniformly dispersed among the layers, which provide various modifications.

Hereinafter, referring to FIG. 3, an organic light emitting diode device according to an embodiment is described.

Referring to FIG. 3, an organic light emitting diode device according to an embodiment may include an anode 10 and a cathode 20 facing each other, an emission layer 50 between the anode 10 and the cathode 20, a hole transport layer (HTL) 30 between the anode 10 and the emission layer 50, and an electron transport layer (ETL) 40 between the cathode 20 and the emission layer 50, like the above embodiment.

However, the organic light emitting diode device according to the present embodiment may include a hole injection layer (HIL) 60 between the anode 10 and the hole transport layer (HTL) 30 and an electron injection layer (EIL) 70 between the cathode 20 and the electron transport layer (ETL) 40, unlike the above embodiment.

The hole injection layer (HIL) 60 may include suitable hole injection materials, e.g., a phthalocyanine compound such as copper phthalocyanine and the like, m-MTDATA[4, 4',4''-tris(3-methylphenylphenylamino)triphenylamine], NPB (N,N-di(1-naphthyl)-N,N-diphenylbenzidine), TDATA, 2T-NATA, Pani/DBSA (polyaniline/dodecylbenzenesulfonic acid), PEDOT/PSS (poly(3,4-ethylenedioxythiophene)/poly(4-styrenesulfonate)), Pani/CSA (polyaniline/camphor sulfonic acid) or PANI/PSS (polyaniline)/poly(4-styrenesulfonate)), and the like.

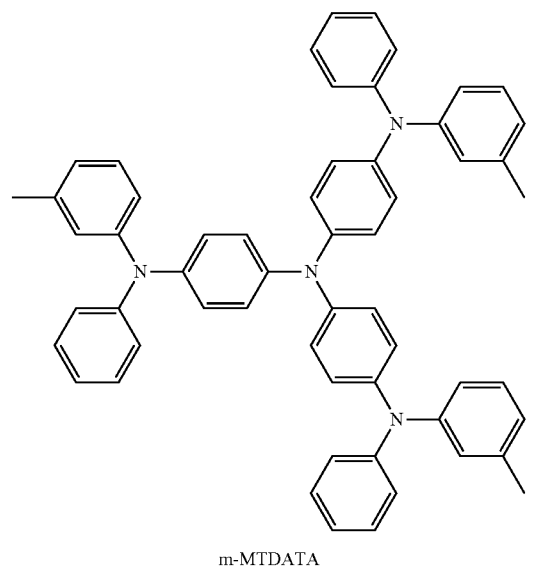

m-MTDATA

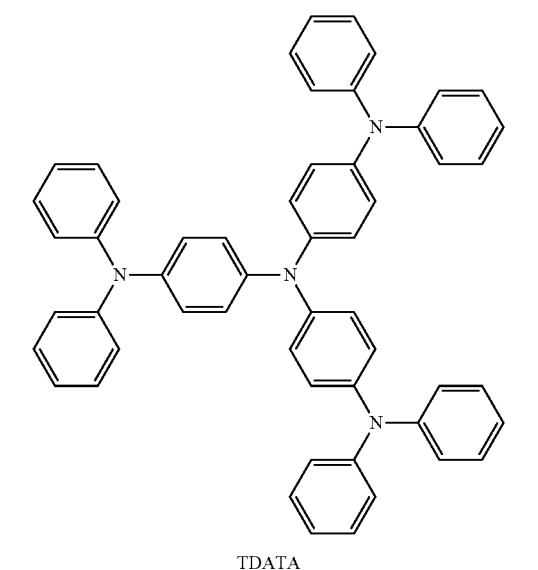

TDATA

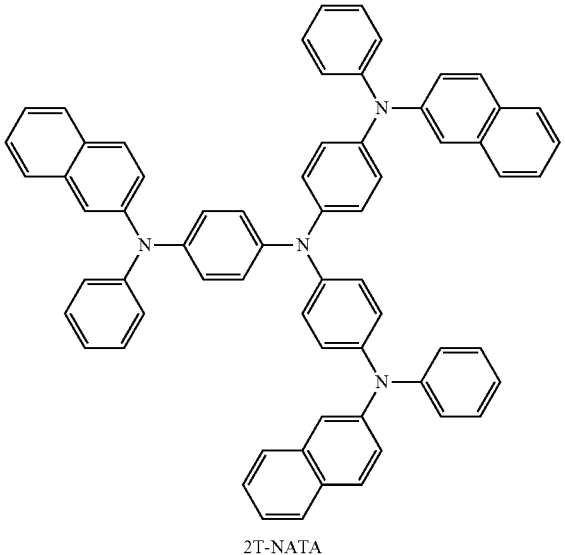

2T-NATA

The hole injection layer (HIL) 60 may further include the above p-dopant in order to help improve film conductivity.

When the hole injection layer (HIL) 60 further includes the p-dopant, the p-dopant may be uniformly or non-uniformly dispersed among the layers and thus various modifications may be realized.

The hole injection layer (HIL) 60 may be formed using various methods such as a vacuum deposition method, a spin coating method, a cast method, or an LB method, on the anode 10.

When the hole injection layer (HIL) 60 is formed by the vacuum deposition, the deposition conditions may be different according to the compound used as the material for a hole injection layer (HIL), the structure of the objective hole injection layer (HIL), and the thermal characteristics, e.g., may be appropriately selected within the ranges of deposit temperature of about 100 to about 500° C., the vacuum degree of about $10^{-8}$ to about $10^{-3}$ torr, and the deposition rate of about 0.01 to about 100 Å/sec.

When the hole injection layer (HIL) 60 is formed by the spin coating, the coating conditions may be different according to the compound used as a material for the hole injection layer (HIL), the structure of the objective hole injection layer (HIL), and the thermal characteristics or the like, but may be suitably selected from a coating speed of about 2,000 rpm to about 5,000 rpm, and/or a heat treatment temperature of about 80° C. to about 200° C. for removing the solvent after coating.

When the emission layer 50 includes a phosphorescent dopant, a hole blocking layer (not shown) may be formed on the emission layer 50 to help reduce the likelihood of and/or prevent the phenomenon in which a triplet exciton or hole diffuses into the electron transport layer (ETL). The hole blocking layer material may be selected from suitable hole blocking layer materials. For example, an oxadiazole derivative or a triazole derivative, phenanthroline derivative, Balq, BCP or the like may be used.

In addition, an electron injection layer (EIL) 70 may be stacked on the electron transport layer (ETL) 40 as a material having functions of easily injecting electrons from the cathode.

The electron injection layer (EIL) 70 may include a suitable material for forming an electron injection layer (EIL), e.g., LiF, NaCl, CsF, $Li_2O$, BaO, or the like. The deposition conditions and the coating conditions of the electron injection layer (EIL) 70 may be different according to the used compound, and may be selected from the conditions that are the same as or similar to forming the hole injection layer (HIL) 60.

The organic light emitting diode device according to an embodiment may have an anode/hole injection layer (HIL)/emission layer/cathode, anode/hole injection layer (HIL)/hole transport layer (HTL)/emission layer/electron transport layer (ETL)/cathode, or anode/hole injection layer (HIL)/hole transport layer (HTL)/emission layer/electron transport layer (ETL)/electron injection layer (EIL)/cathode structure. In an implementation, the organic light emitting diode device may have a structure of anode/functional layer simultaneously having hole injection function and hole transport function/emission layer/electron transport layer (ETL)/cathode or anode/functional layer simultaneously having a hole injection function and a hole transport function/emission layer/electron transport layer (ETL)/electron injection layer (EIL)/cathode. In an implementation, the organic light emitting diode device may have a structure of anode/hole transport layer (HTL)/emission layer/functional layer simultaneously having electron injection function and electron transport function/cathode, anode/hole injection layer (HIL)/emission layer/functional layer simultaneously having electron injection function and electron transport function/cathode, or anode/hole injection layer (HIL)/hole transport layer (HTL)/emission layer/functional layer simultaneously having electron injection function and electron transport function/cathode structure.

The organic light emitting diode device may be, e.g., electrically connected to a thin film transistor, and the thin film transistor may be between the substrate and the electrode.

In an implementation, each layer of the organic light emitting diode device according to an embodiment may be formed by the deposition using the organic compound according to an embodiment and/or may be also formed by a wet method of coating the organic compound solution according to an embodiment.

Another embodiment may provide a display device including the organic light emitting diode device according to an embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE

Synthesis Example 1

Synthesis of Compound Represented by Chemical Formula 3

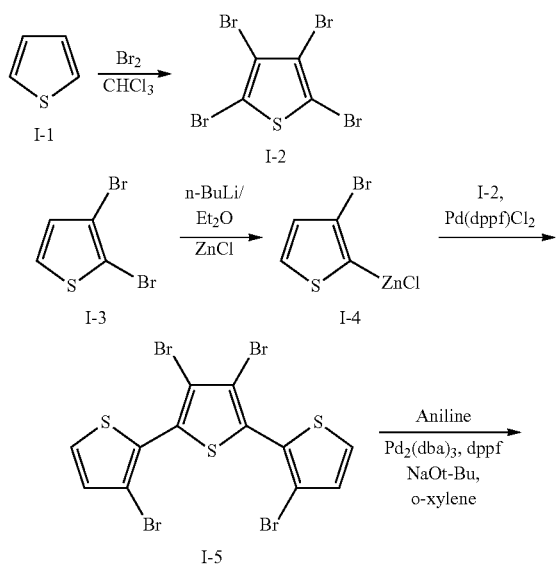

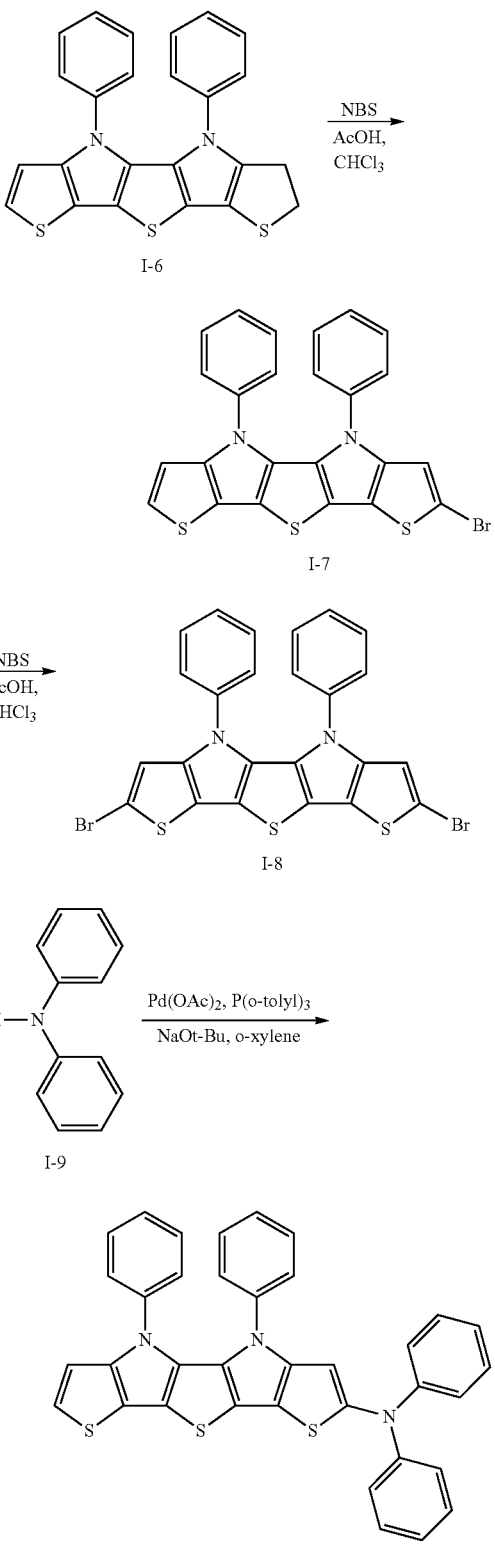

the reaction was complete, bromine remaining therein was removed by using an aqueous sodium bisulfite solution. A solid produced therein was filtered, washed several times with water, and vacuum-dried, obtaining 7.5 g (yield: 79%) of an intermediate I-2 (2,3,4,5-tetrabromothiophene).

EI-MS, m/e: 395.65 (calculation value), 395.66 (measurement value)

Synthesis of Intermediate I-5

3.62 g (14.9 mmol) of 2,3-dibromothiophene was dissolved in 15 ml of diethylether as a solvent, n-butyl lithium was slowly added dropwise thereto at −78° C., the mixture was agitated at the same temperature for one hour, and 2.05 g (15.0 mmol) of zinc chloride dissolved in 29 ml of tetrahydrofuran was added thereto. This reactant was agitated at 0° C. for 1 hour, 2 g (5.0 mmol) of the intermediate I-2 and 0.219 g (0.3 mmol) of Pd(dppf)Cl$_2$ were added thereto, and the mixture was agitated at 50° C. for 24 hours. The resultant was cooled down to ambient temperature, an aqueous ammonium chloride solution was added thereto, and the mixture was extracted by using methylene chloride. After vacuum distillation, a product therein was separated through column chromatography. The resultant was recrystallized, obtaining 2.1 g (yield: 74%) of an intermediate I-5 (3,3',3'',4'-tetrabromo-2,2':5',2''-terthiophene). $^1$H NMR (300 MHz, CDCl$_3$), d (ppm): 7.27-7.09 (4H, m)

EI-MS, m/e: 559.62 (calculation value), 559.62 (measurement value)

Synthesis of Intermediate I-6

1 g (2 mmol) of the intermediate I-5 and 0.45 g (4.8 mmol) of aniline were agitated in an o-xylene solvent by using Pd$_2$(dba)$_3$, dppf, and NaOt-Bu at 110° C. for 6 hours. Subsequently, the agitated resultant was cooled down to ambient temperature, distilled water was added thereto, and the mixture was extracted with methylene chloride. After vacuum distillation, a product therein was separated through column chromatography (hexane/ethyl acetate 20:1->5:1). The resultant was extracted by using ethyl acetate and pentane, and the extract was filtered and vacuum-dried, obtaining 0.33 g (yield: 43%) of an intermediate I-6 (N,N'-diphenyl-dithieno[2,3-d:2',3'-d']thieno[3,2-b:3',2'-b']dipyrrole).

$^1$H NMR (300 MHz, CDCl$_3$), d (ppm): 8.30-8.19 (2H, m), 7.62-7.52 (4H, m), 7.43-7.29 (6H, m), 7.25-7.14 (2H, m)

EI-MS, m/e: 426.03 (calculation value), 426.02 (measurement value)

Synthesis of Intermediate I-7

1 g (2.35 mmol) of the intermediate I-6 was reacted with 0.46 g (2.58 mmol) of N-bromosuccinimide, 20 ml of acetic acid and 20 ml of chloroform solvent at 4° C., the reactant was extracted with chloroform, and the extract was washed with an aqueous sodium bicarbonate solution. An organic layer obtained therefrom was dried with magnesium sulfate and vacuum-distilled, and a product produced therein was separated through column chromatography. The product was vacuum-dried, obtaining 0.48 g (yield: 38%) of an intermediate I-7 (2-bromo-N,N-diphenyl-dithieno[2,3-d:2',3'-d']thieno[3,2-b:3',2'-b']dipyrrole).

$^1$H NMR (300 MHz, CDCl$_3$), d (ppm): 8.29-8.21 (1H, m), 8.12 (1H, s), 7.67-7.47 (4H, m), 7.45-7.22 (6H, m), 7.18-7.07 (1H, m)

EI-MS, m/e: 503.94 (calculation value), 503.95 (measurement value)

Synthesis of Intermediate I-8

1 g (2.35 mmol) of the intermediate I-6 was reacted with 0.92 g (5.16 mmol) of N-bromosuccinimide in acetic acid (20 ml) and chloroform (20 ml) as a solvent at 4° C., the reactant was extracted with chloroform, and the extract was Synthesis of Intermediate I-2

2 g (23.8 mmol) of thiophene was dissolved in 3 ml of chloroform, and 15.04 g (95.2 mmol) of bromine was slowly dropped thereto at ambient temperature. The solution was agitated at a temperature of 60 to 70° C. for 12 hours. When washed with an aqueous sodium bicarbonate solution. An organic layer obtained therefrom was dried with magnesium sulfate and vacuum-distilled, and a product therein was separated through column chromatography. The product was vacuum-dried, obtaining 0.84 g (yield: 62%) of an intermediate I-8 (2,7-dibromo-N,N-diphenyl-dithieno[2,3-d:2',3'-d']thieno[3,2-b:3',2'-b']dipyrrole).

$^1$H NMR (300 MHz, CDCl$_3$), d (ppm): 7.97-7.89 (2H, s), 7.61-7.51 (414, m), 7.42-7.32 (4H, m), 7.24-7.16 (2H, m)

EI-MS, m/e: 581.85 (calculation value), 581.86 (measurement value)

Synthesis of Chemical Formula 3

1 g (1.98 mmol) of the intermediate I-7 and 0.4 g (2.38 mmol) of diphenylamine was agitated in an o-xylene solvent by using Pd(OAc)$_2$, P(o-tolyl)$_3$, and NaOt-Bu at 160° C. for 48 hours. After vacuum distillation, a product therein was separated through column chromatography. The product was vacuum-dried, obtaining 0.76 g (65%) of a compound represented by Chemical Formula 3 (2-bisphenylamino-N,N'-diphenyl-dithieno[2,3-d:2',3'-d']thieno[3,2-b:3',2'-b']dipyrrole).

$^1$H NMR (300 MHz, CDCl$_3$), d (ppm): 8.30-8.20 (114, d), 7.64-7.53 (4H, m), 7.42-7.27 (6H, m), 7.26-7.17 (6H, m), 7.16-7.08 (414, m), 6.98-6.88 (2H, m)

EI-MS, m/e: 593.11 (calculation value), 593.10 (measurement value)

Synthesis Example 2

Synthesis of Compound Represented by Chemical Formula 19

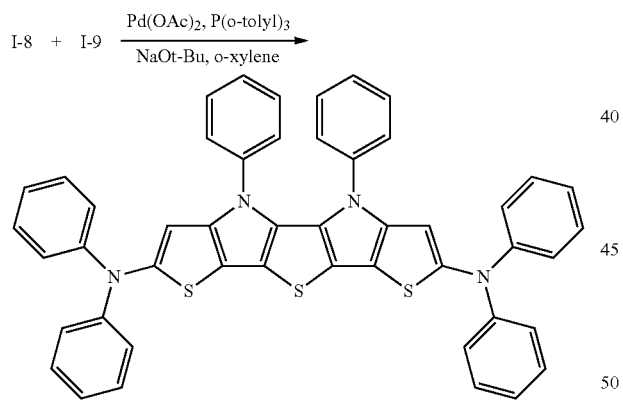

Synthesis of Chemical Formula 19

1 g (1.71 mmol) of the intermediate I-8 and 0.7 g (4.11 mmol) of diphenylamine were agitated in an o-xylene solvent by using Pd(OAc)$_2$, P(o-tolyl)$_3$, and NaOt-Bu at 160° C. for 48 hours. After vacuum distillation, a product therein was separated through column chromatography. The product was vacuum-dried, obtaining 0.73 g (56%) of a compound represented by Chemical Formula 19 (2,7-bis[bisphenylamino]-N,N-diphenyl-dithieno[2,3-d:2',3'-d]thieno[3,2-b:3',2'-b]dipyrrole).

$^1$H NMR (300 MHz, CDCl$_3$), d (ppm): 7.67-7.60 (4H, m), 7.44-7.37 (4H, m), 7.33-7.21 (12H, m), 7.20-7.13 (8H, m), 7.01-6.94 (4H, m)

EI-MS, m/e: 760.18 (calculation value), 760.17 (measurement value)

Synthesis Example 3

Synthesis of Compound Represented by Chemical Formula 31

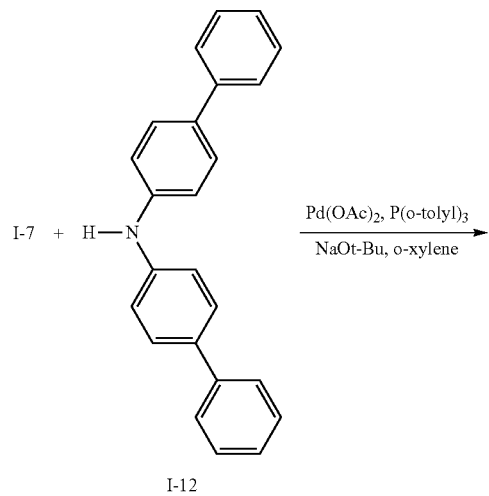

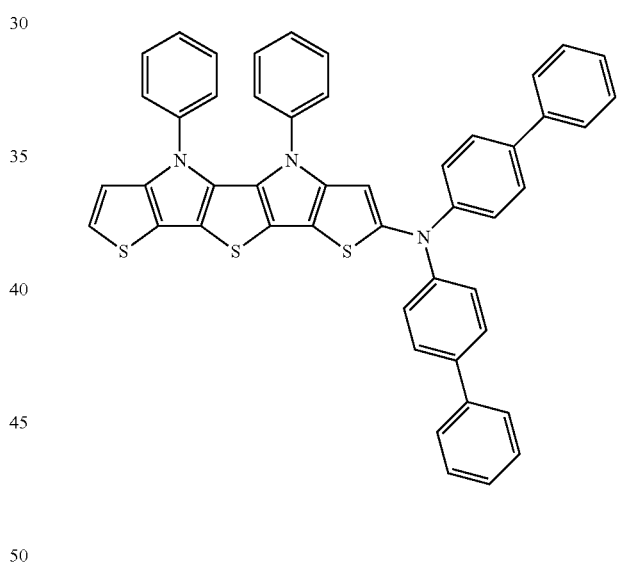

Synthesis of Compound Represented by Chemical Formula 31

1 g (1.98 mmol) of the intermediate I-7 and 0.76 g (2.38 mmol) of bis(4-biphenyl)amine were agitated in an o-xylene solvent by using Pd(OAc)$_2$, P(o-tolyl)$_3$, and NaOt-Bu at 160° C. for 48 hours. After vacuum distillation, a product therein was separated through column chromatography. The product was vacuum-dried, obtaining 0.95 g (64%) of a compound represented by Chemical Formula 31 (2-bis(4-biphenyl)amino-N,N'-diphenyl-dithieno[2,3-d:2',3'-d]thieno[3,2-b:3',2'-b']dipyrrole).

$^1$H NMR (300 MHz, CDCl$_3$), d (ppm): 8.28-8.21 (1H, d), 7.69-7.59 (12H, m), 7.50-7.44 (4H, m), 7.44-7.35 (11H, m), 7.35-7.31 (1H, m), 7.29-7.20 (2H, m)

EI-MS, m/e, 745.17 (calculation value), 745.18 (measurement value)

Synthesis Example 4

Synthesis of Compound Represented by Chemical Formula 47

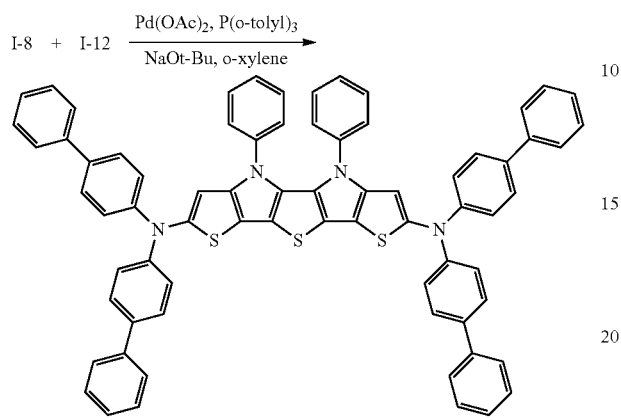

Synthesis of Compound Represented by Chemical Formula 47

1 g (1.71 mmol) of the intermediate I-8 and 1.32 g (4.11 mmol) of bis(4-biphenyl)amine were agitated in an o-xylene solvent by using Pd(OAc)$_2$, P(o-tolyl)$_3$, and NaOt-Bu at 160° C. for 48 hours. After vacuum distillation, a product therein was separated through column chromatography. The product was vacuum-dried, obtaining 1.1 g (60%) of a compound represented by Chemical Formula 47 (2,7-bis[bis(4-biphenyl)amino]-N,N'-diphenyl-dithieno[2,3-d:2',3'-d]thieno[3,2-b:3',2'-b']dipyrrole).

$^1$H NMR (300 MHz, CDCl3), d (ppm): 7.68-7.60 (20H, m), 7.51-7.42 (8, m), 7.43-7.32 (18H, m), 7.27-7.21 (2H, m)

EI-MS, m/e: 1064.30 (calculation value), 1064.31 (measurement value)

Other compounds may be synthesized by referring to the aforementioned synthesis methods and raw materials.

EXAMPLES

Example 1

An anode was manufactured by cutting a 15 Ω/cm$^2$ (1,200 Å) ITO glass substrate made by Corning Inc. into a size of 50 mm×50 mm×0.7 mm, ultrasonic wave-cleaning it by using isopropyl alcohol and pure water respectively for 5 minutes, radiating a ultraviolet (UV) ray for 30 minutes, exposing it to ozone, and mounting the glass substrate in a vacuum deposition device. On the substrate, a hole injection layer (HIL) was formed to be 600 Å-thick by vacuum-depositing 4,4',4''-tris(N-(2-naphthyl)-N-phenyl-amino)-triphenylamine (hereinafter, 2-TNATA), subsequently, a hole transport layer (HTL) was formed to be 300 Å thick by vacuum-depositing 4,4'-bis[N-(1-naphthyl)-N-phenylamino]biphenyl (hereinafter, NPB) as a hole transport compound. On the hole transport layer (HTL), an emission layer was formed to be 300 Å thick by simultaneously depositing the compound represented by Chemical Formula 3 and bis-(1-phenylisoquinolyl)iridium(III) acetylacetonate (hereinafter, (piq)$_2$Ir(acac)) in a weight ratio of 87:13. Subsequently, on the emission layer, an electron transport layer (ETL) was formed to be 300 Å thick by depositing tris-(8-hydroxyquinoline)aluminum (hereinafter, Alq$_3$), on this electron transport layer (ETL), and then, a LiF/Al electrode was formed by forming a 10 Å thick electron injection layer (EIL) through deposition of a halgenated alkaline metal, LiF and a 3,000 Å-thick cathode electrode through vacuum-deposition of Al, manufacturing an organic light emitting diode device.

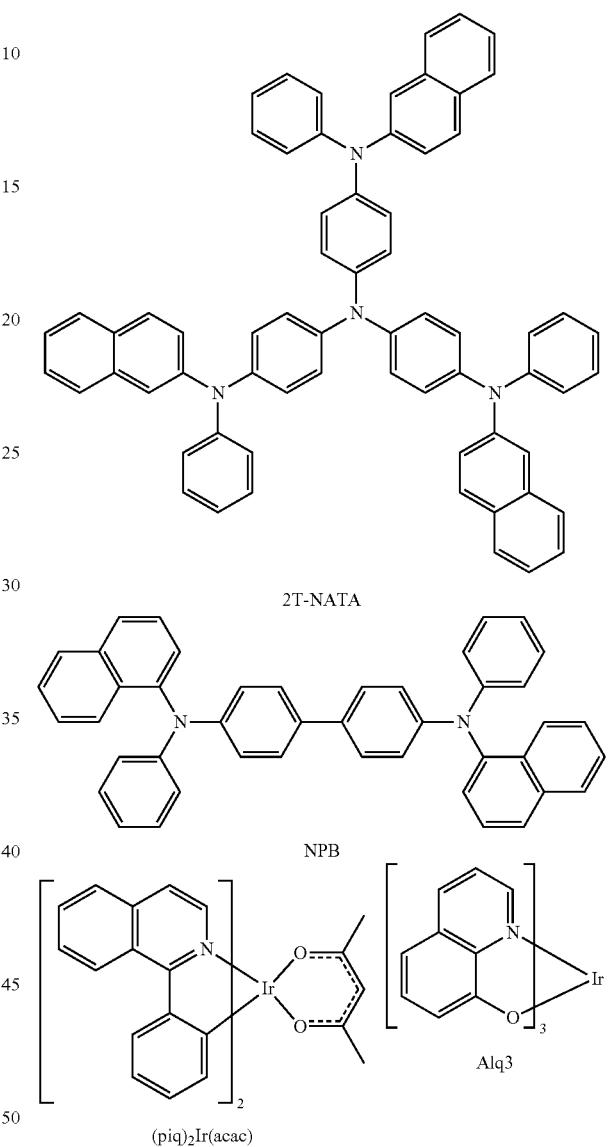

2T-NATA

NPB (piq)$_2$Ir(acac)

Alq3

Chemical Formula 3

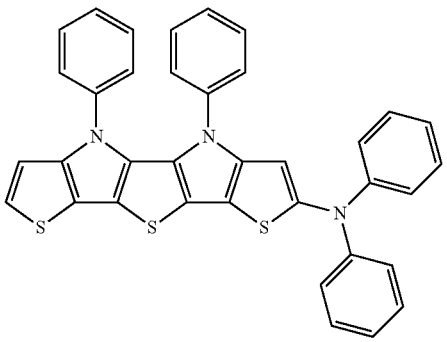

Example 2

An organic light emitting diode device was manufactured according to the same method as Example 1 except for using a compound represented by Chemical Formula 5 to form the emission layer instead of the compound represented by Chemical Formula 3.

Chemical Formula 5

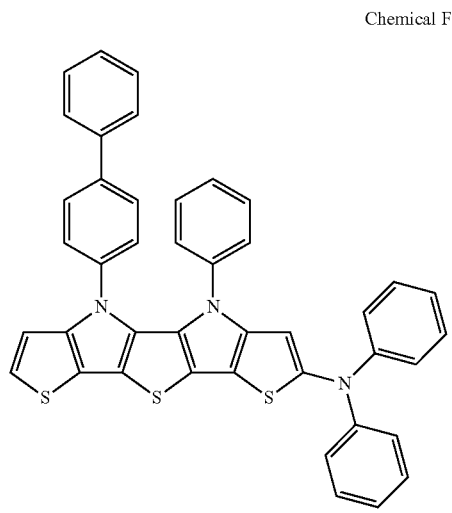

Example 3

An organic light emitting diode device was manufactured according to the same method as Example 1 except for using a compound represented by Chemical Formula 9 to form the emission layer instead of the compound represented by Chemical Formula 3.

Chemical Formula 9

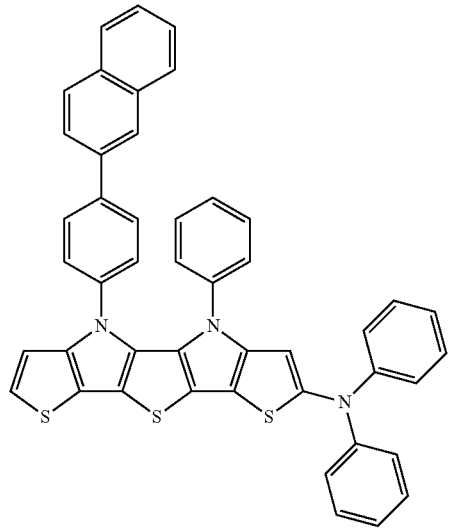

Example 4

An organic light emitting diode device was manufactured according to the same method as Example 1 except for using a compound represented by Chemical Formula 11 to form the emission layer instead of the compound represented by Chemical Formula 3.

Chemical Formula 11

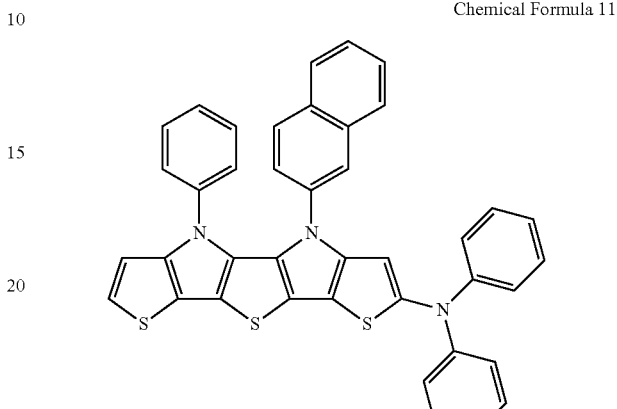

Example 5

An organic light emitting diode device was manufactured according to the same method as Example 1 except for using a compound represented by Chemical Formula 12 to form the emission layer instead of the compound represented by Chemical Formula 3 and using iridium and tris(2-phenylpyridine) (hereinafter, Ir(ppy)$_3$) instead of (piq)$_2$(acac).

Chemical Formula 12

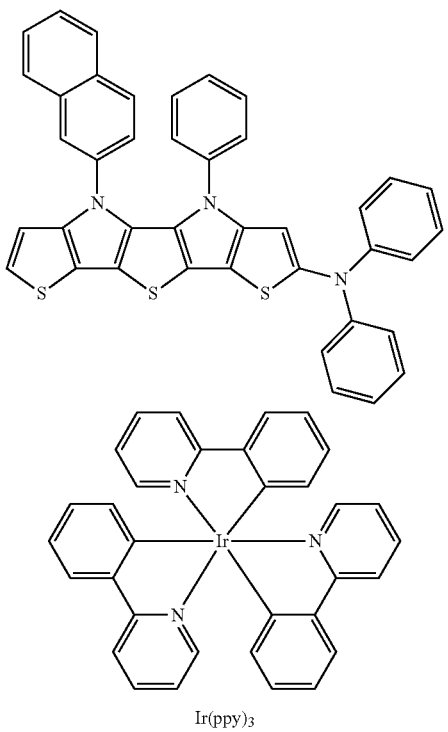

Ir(ppy)$_3$

Example 6

An organic light emitting diode device was manufactured according to the same method as Example 5 except for using a compound represented by Chemical Formula 17 to form the emission layer instead of the compound represented by Chemical Formula 12.

Chemical Formula 17

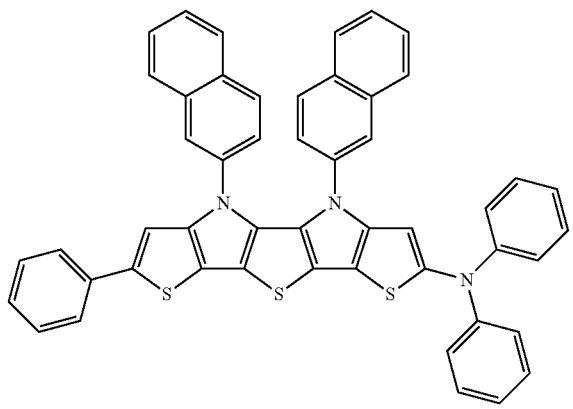

Example 7

An organic light emitting diode device was manufactured according to the same method as Example 5 except for using a compound represented by Chemical Formula 23 to form the emission layer instead of the compound represented by Chemical Formula 12.

Chemical Formula 23

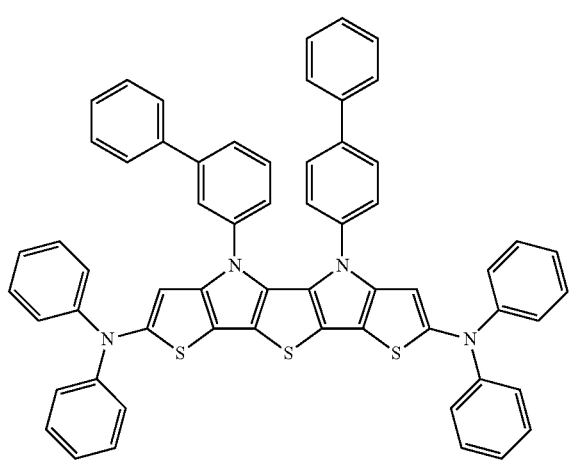

Example 8

An organic light emitting diode device was manufactured according to the same method as Example 5 except for using a compound represented by Chemical Formula 25 to form the emission layer instead of the compound represented by Chemical Formula 12.

Chemical Formula 25

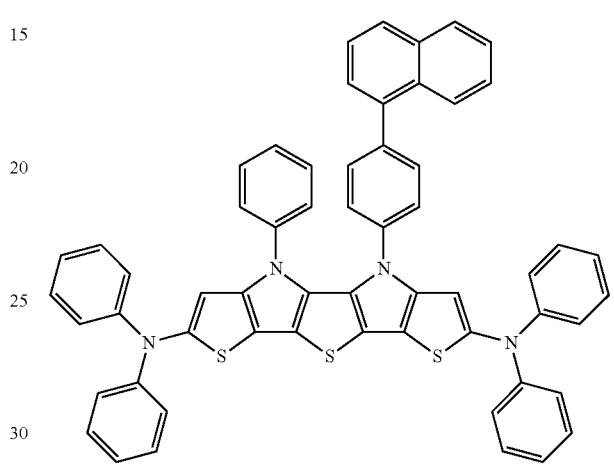

Example 9

An organic light emitting diode device was manufactured according to the same method as Example 1 except for using 9,10-di-naphthalene-2-yl-anthracene (hereinafter, ADN) instead of the compound represented by Chemical Formula 3 to form the emission layer, 1,4-bis-(2,2-diphenylvinyl) biphenyl, Hereinafter, DPVBi) instead of the (piq)$_2$Ir(acac), simultaneously depositing ADN and DPVBi in a weight ratio 98:2, and a compound represented by Chemical Formula 31 instead of the Alq$_3$ to form the electron transport layer (ETL).

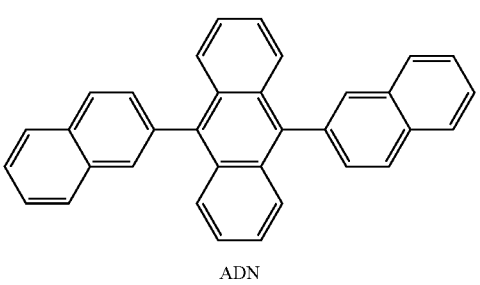

ADN

-continued

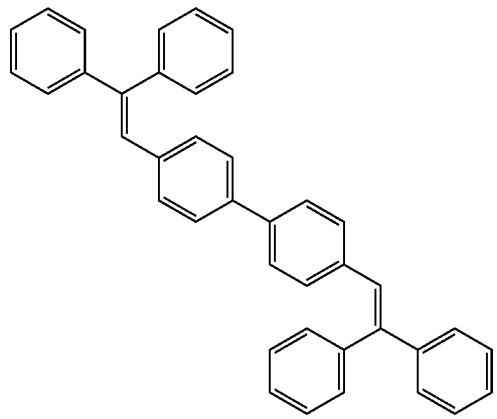

DPVBi

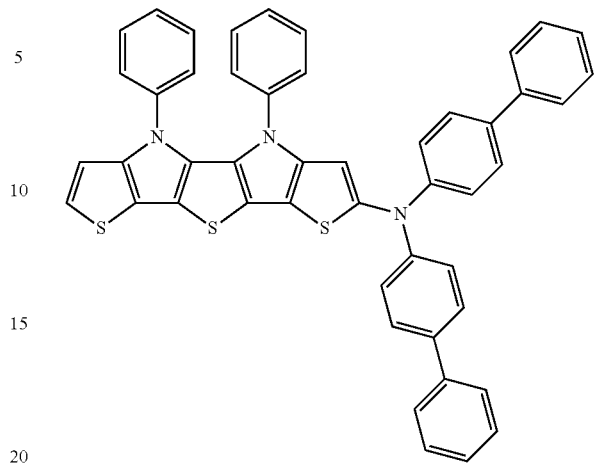

Chemical Formula 31

Example 10

An organic light emitting diode device was manufactured according to the same method as Example 9 except for using a compound represented by Chemical Formula 47 to form the electron transport layer instead of the compound represented by Chemical Formula 31.

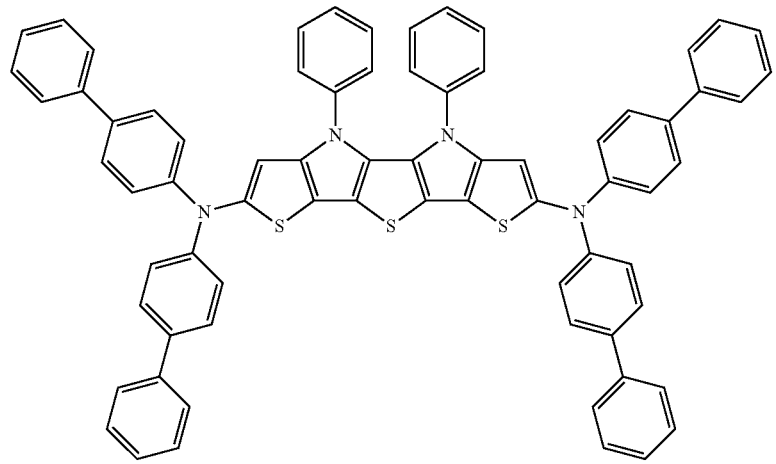

Chemical Formula 47

Example 11

An organic light emitting diode device was manufactured according to the same method as Example 9 except for using Alq$_3$ instead of the compound represented by Chemical Formula 31 to form the electron transport layer (ETL) and a compound represented by Chemical Formula 50 instead of NPB to form the hole transport layer (HTL).

Chemical Formula 50

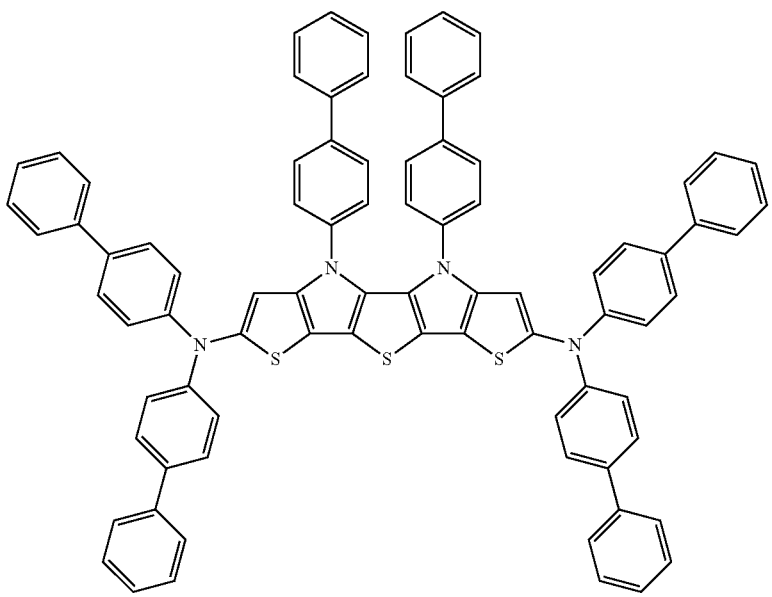

Example 12

An organic light emitting diode device was manufactured according to the same method as Example 11 except for using a compound represented by Chemical Formula 52 instead of the compound represented by Chemical Formula 50 to form the hole transport layer (HTL).

Chemical Formula 52

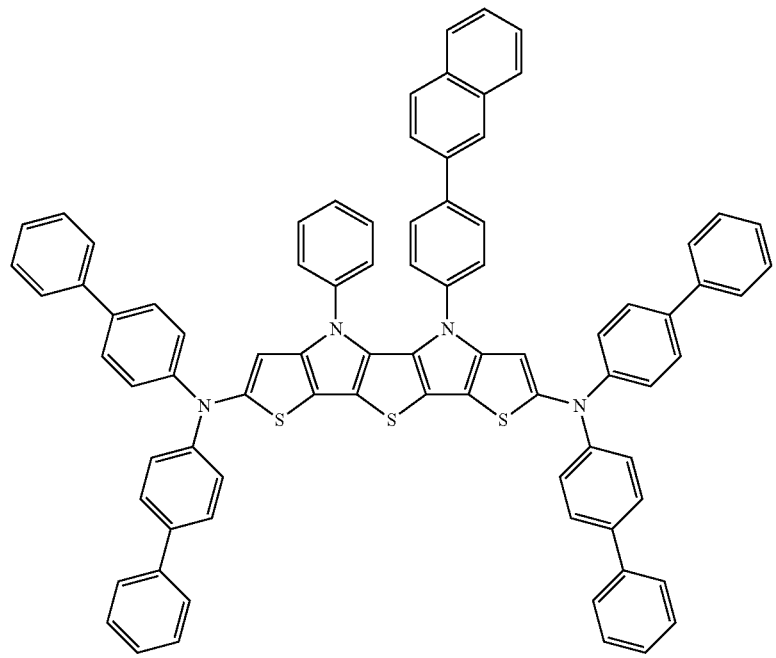

Comparative Example 1

An organic light emitting diode device was manufactured according to the same method as Example 1 except for using 4,4'-bis(carbazol-9-yl)biphenyl (hereinafter, CBP) instead of the compound represented by Chemical Formula 3 to form the emission layer.

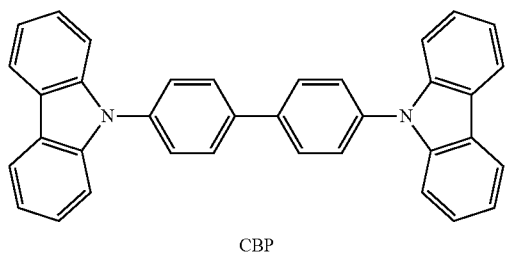 [SMILES: c1ccc2c(c1)c1ccccc1n2-c1ccc(-c2ccc(-n3c4ccccc4c4ccccc43)cc2)cc1 ; "CBP"]

CBP

Comparative Example 2

An organic light emitting diode device was manufactured according to the same method as Example 5 except for using CBP instead of the compound represented by Chemical Formula 12 to form the emission layer.

Comparative Example 3

An organic light emitting diode device was manufactured according to the same method as Example 9 except for using Alq$_3$ instead of the compound represented by Chemical Formula 31 to form the electron transport layer (ETL).

Comparative Example 4

An organic light emitting diode device was manufactured according to the same method as Example 11 except for using NPB instead of the compound represented by Chemical Formula 50 to form the hole transport layer (HTL).

Evaluation (1) Measurement of Current Density Change Depending on Voltage Change Current values flowing in the unit device of the manufactured organic light emitting devices were measured while increasing the voltage from 0 V to 10 V using a current-voltage meter (Keithley 2400), and the measured current values were divided by an area to provide the results.

(2) Measurement of Luminance Change depending on Voltage Change

Luminance of the manufactured organic light emitting devices was measured for luminance, while increasing the voltage from 0 V to 10 V using a luminance meter (Minolta Cs-1000A).

(3) Measurement of Luminous Efficiency

Current efficiency (cd/A) at the same luminance (cd/m$^2$) were calculated by using the luminance, current density, and voltages (V) from the items (1) and (2).

(4) Measurement of Life-Span

The luminance decrease depending on a time of the organic light emitting devices was measured by using a life-span measurement system by Polaronics Inc., and a half life-span where the luminance decreased down to ½ relative to the initial luminance was measured.

Evaluation 1: Emission Layer

Characteristics of the organic light emitting diode devices according to Examples 1 to 8 and Comparative Examples 1 and 2 were evaluated.

The results are provided in Table 1.

TABLE 1

| | Light emitting material | Driving voltage (V) | Current density (mA/cm$^2$) | Luminance (cd/m$^2$) | Efficiency (cd/A) | Light emitting color | Half-life span (hr @100 mA/cm$^2$) |
|---|---|---|---|---|---|---|---|
| Example 1 | Chemical Formula 3 | 6.0 | 4.5 | 1000 | 22.3 | red | 634 |
| Example 2 | Chemical Formula 5 | 6.4 | 4.7 | 1000 | 21.5 | red | 605 |
| Example 3 | Chemical Formula 9 | 6.1 | 4.8 | 1000 | 20.8 | red | 652 |
| Example 4 | Chemical Formula 11 | 5.8 | 4.7 | 1000 | 21.1 | red | 591 |
| Example 5 | Chemical Formula 12 | 5.6 | 3.5 | 1000 | 28.6 | green | 325 |
| Example 6 | Chemical Formula 17 | 5.8 | 3.4 | 1000 | 29.3 | green | 306 |
| Example 7 | Chemical Formula 23 | 5.1 | 3.3 | 1000 | 30.1 | green | 315 |
| Example 8 | Chemical Formula 25 | 5.3 | 3.4 | 1000 | 29.6 | green | 292 |
| Comparative Example 1 | CBP | 7.4 | 8.8 | 1000 | 11.4 | red | 346 |
| Comparative Example 2 | CBP | 7.5 | 6.2 | 1000 | 16.2 | green | 192 |

Referring to Table 1, the organic light emitting diode devices according to Examples 1 to 8 showed improved driving voltage and efficiency characteristics, compared with the organic light emitting diode devices according to Comparative Examples 1 and 2.

Evaluation 2: Electron Transport Layer (ETL)

Characteristic of the organic light emitting diode devices according to Examples 9 and 10 and Comparative Example 3 were evaluated.

The results are provided in Table 2.

TABLE 2

|  | Electron transport material | Driving voltage (V) | Current density (mA/cm$^2$) | Luminance (cd/m$^2$) | Efficiency (cd/A) | Light emitting color | Half-life-span (hr @100 mA/cm$^2$) |
|---|---|---|---|---|---|---|---|
| Example 9 | Chemical Formula 31 | 6.1 | 50 | 2974 | 4.9 | blue | 284 |
| Example 10 | Chemical Formula 47 | 6.2 | 50 | 2883 | 4.8 | blue | 231 |
| Comparative Example 3 | Alq$_3$ | 7.9 | 50 | 1680 | 3.4 | blue | 132 |

Examples 9 and 10 showed improved driving voltage and efficiency characteristics, compared with the organic light emitting diode devices according to Comparative Example 3.

Evaluation 3: Hole Transport Layer (HTL)

Characteristics of the organic light emitting diode devices according to Examples 11 and 12 and Comparative Example 4 were evaluated.

The results are provided in Table 3.

TABLE 3

|  | Hole transport material | Driving voltage (V) | Current density (mA/cm$^2$) | Luminance (cd/m$^2$) | Efficiency (cd/A) | Light emitting color | Half-life span (hr @100 mA/cm$^2$) |
|---|---|---|---|---|---|---|---|
| Example 11 | Chemical Formula 50 | 5.9 | 50 | 3421 | 4.9 | blue | 304 |
| Example 12 | Chemical Formula 52 | 6.1 | 50 | 3182 | 5.0 | blue | 320 |
| Comparative Example 4 | NPB | 7.9 | 50 | 1680 | 3.4 | blue | 132 |

Referring to Table 3, the organic light emitting diode devices according to Examples 11 and 12 showed improved driving voltage, efficiency, and life-span characteristics, compared with the organic light emitting diode device according to Comparative Example 4.

The compound according to an embodiment may be a useful material having a high glass transition temperature and may help crystallization and accordingly, may be used to manufacture an organic light emitting diode device having high efficiency, a low voltage, high luminance, and a long life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

<Description of Symbols>

10: anode  20: cathode
30: hole transport layer (HTL)  40: electron transport layer (ETL)
50: emission layer  60: hole injection layer (HIL)
70: electron injection layer (EIL)  100: organic layer

What is claimed is:

1. A compound represented by the following Chemical Formula 1:

[Chemical Formula 1]

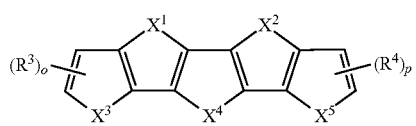

wherein, in Chemical Formula 1,
X$^1$ is —NR$^1$—, —S—, —O—, or —S(O)$_2$—,
X$^2$ is —NR$^2$—, —S—, —O—, or —S(O)$_2$—,
X$^3$ to X$^5$ are each independently —S—, —O—, or —S(O)$_2$—,
R$^1$ to R$^4$ are each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or a combination thereof, at least one of $R^3$ or $R^4$ being a diaryl substituted amine group, and o and p are each independently integers of 0 to 2, at least one of o or p being 1 or 2.

2. The compound as claimed in claim 1, wherein:
$X^1$ is $—NR^1—$,
$X^2$ is $—NR^2—$,
$X^3$ to $X^5$ are each $—S—$, and
$R^1$ and $R^2$ are each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or combination thereof.

3. The compound as claimed in claim 2, wherein $R^1$ and $R^2$ are each independently a substituted or unsubstituted C6 to C30 aryl group.

4. The compound as claimed in claim 2, wherein $R^1$ and $R^2$ are each independently a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group.

5. The compound as claimed in claim 1, wherein the aryl group of the diaryl substituted amine group is a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group.

6. The compound as claimed in claim 1, wherein the compound represented by Chemical Formula 1 is represented by the following Chemical Formula 2:

[Chemical Formula 2]

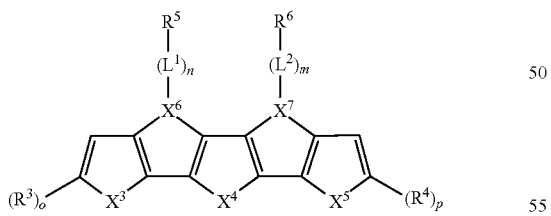

wherein, in the above Chemical Formula 2,
$X^6$ and $X^7$ are N,
$X^3$ to $X^5$ are each independently $—S—$, $—O—$, or $—S(O)_2—$,
$R^3$ to $R^6$ are each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a cyano group, a nitro group, a hydroxy group, a carboxyl group, or a combination thereof, at least one of $R^3$ and $R^4$ is a diaryl substituted amine group, $L^1$ and $L^2$ are each independently a substituted or unsubstituted C1 to C30 alkylene group, a substituted or unsubstituted C6 to C30 arylene group, a substituted or unsubstituted C2 to C30 heteroarylene group, or a combination thereof, and m, n, o and p are each independently integers of 0 to 2, at least one of o or p being 1 or 2.

7. The compound as claimed in claim 6, wherein the $L^1$ and $L^2$ are each independently a substituted or unsubstituted C6 to C30 arylene group.

8. The compound as claimed in claim 1, wherein the compound represented by Chemical Formula 1 is represented by one of the following Chemical Formulae 3 to 58:

[Chemical Formula 3]

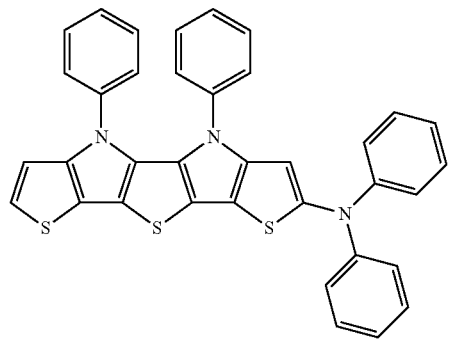

[Chemical Formula 4]

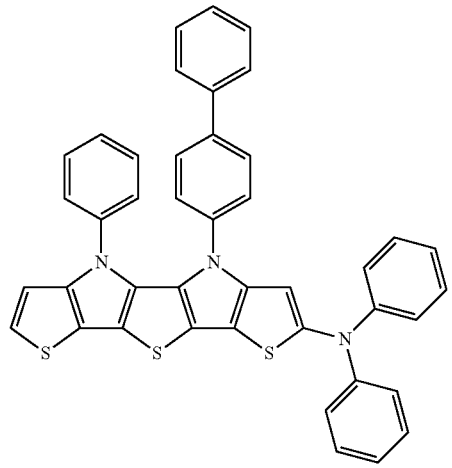

[Chemical Formula 5]
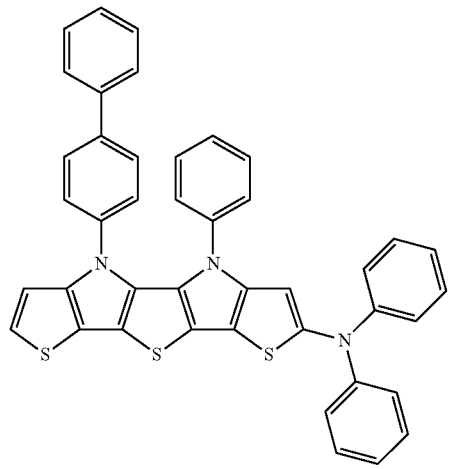
[Chemical Formula 6]
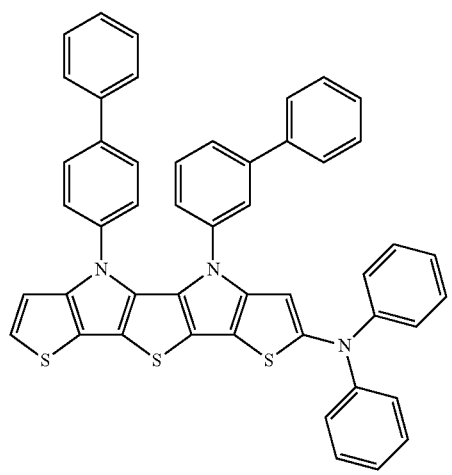
[Chemical Formula 7]
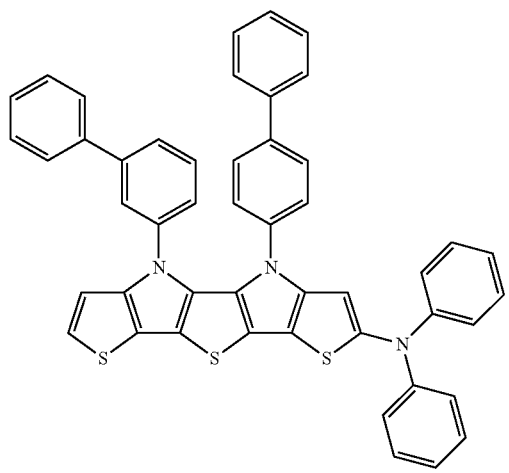
[Chemical Formula 8]
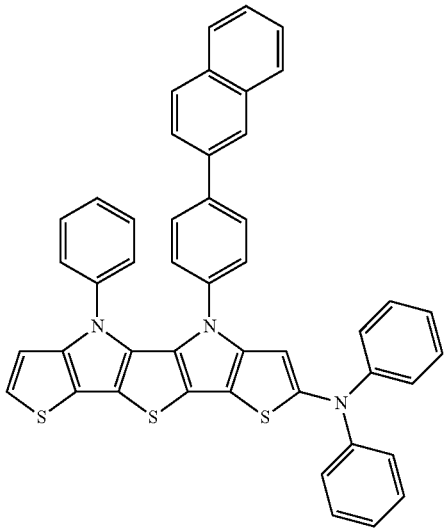
[Chemical Formula 9]
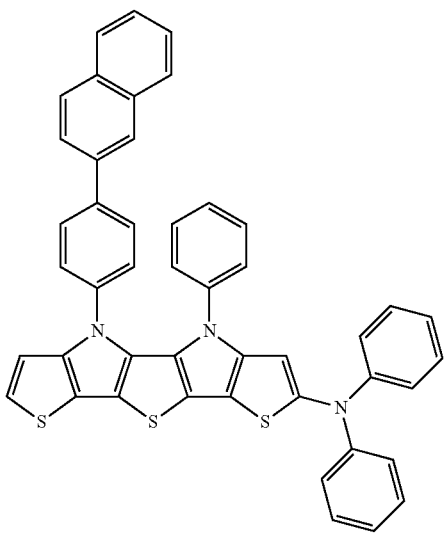
[Chemical Formula 10]
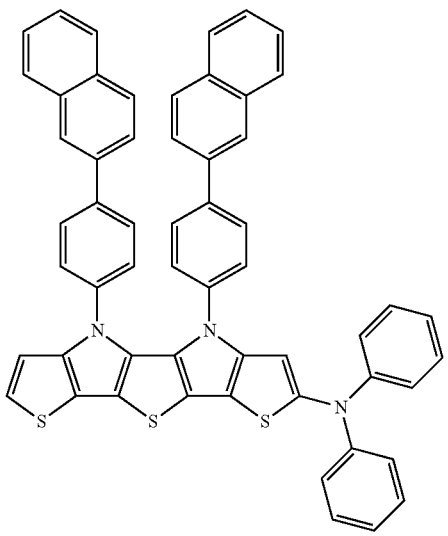

[Chemical Formula 11]
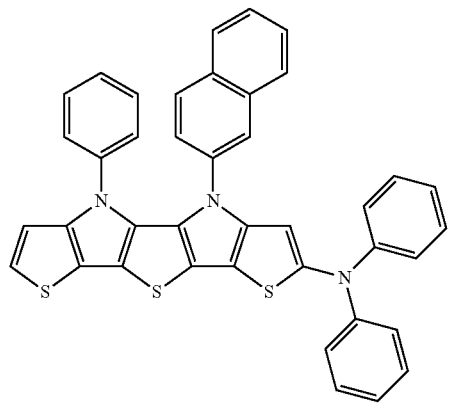
[Chemical Formula 12]
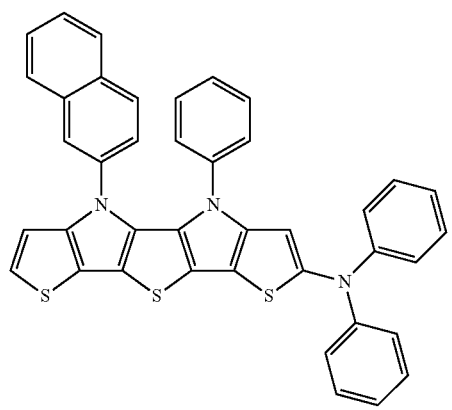
[Chemical Formula 13]
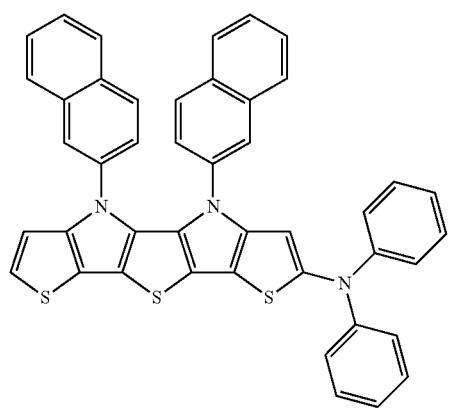
[Chemical Formula 14]
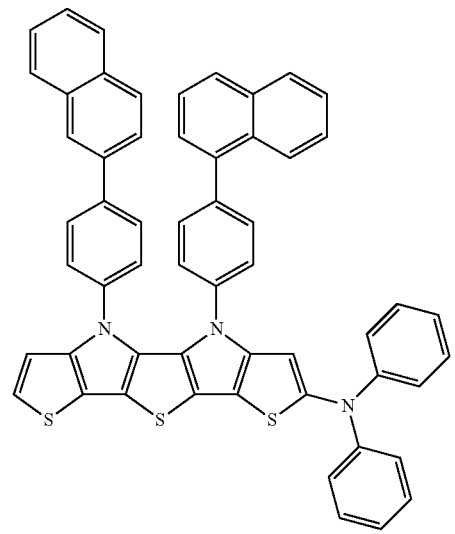
[Chemical Formula 15]
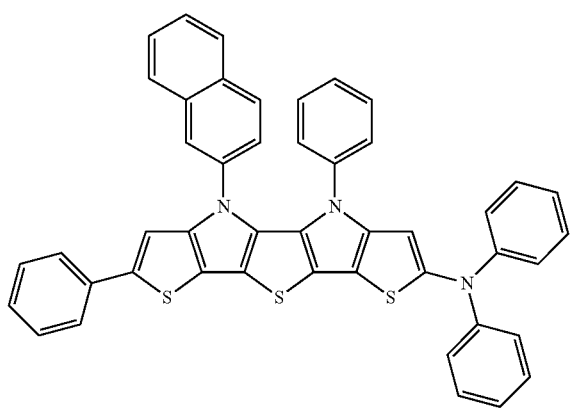
[Chemical Formula 16]

[Chemical Formula 17]
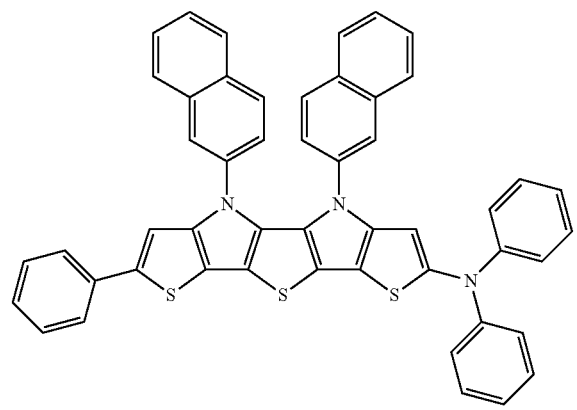
[Chemical Formula 18]
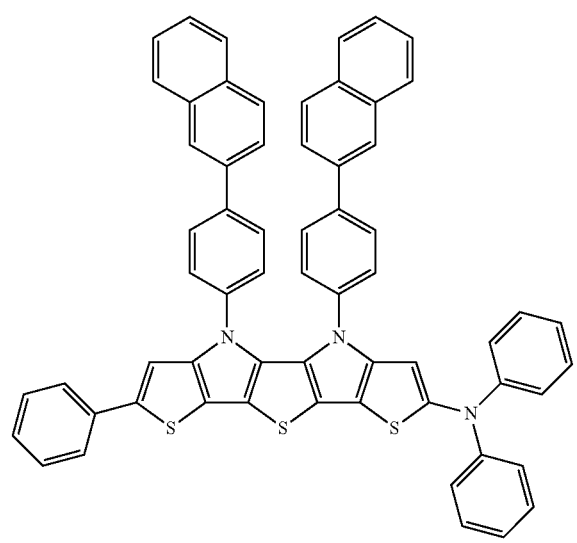
[Chemical Formula 19]
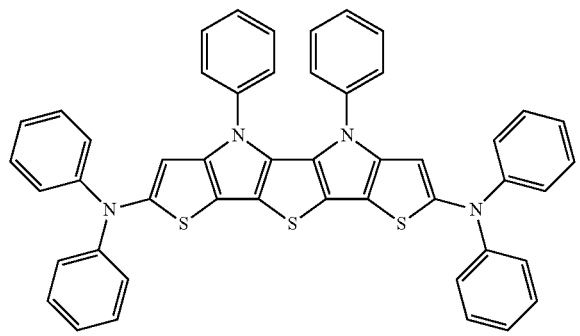
[Chemical Formula 20]
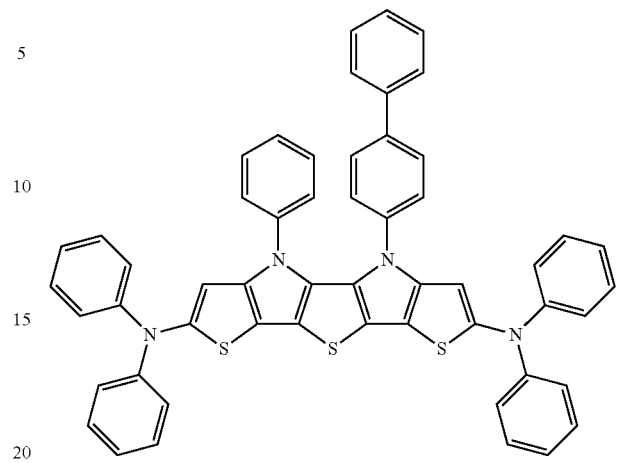
[Chemical Formula 21]
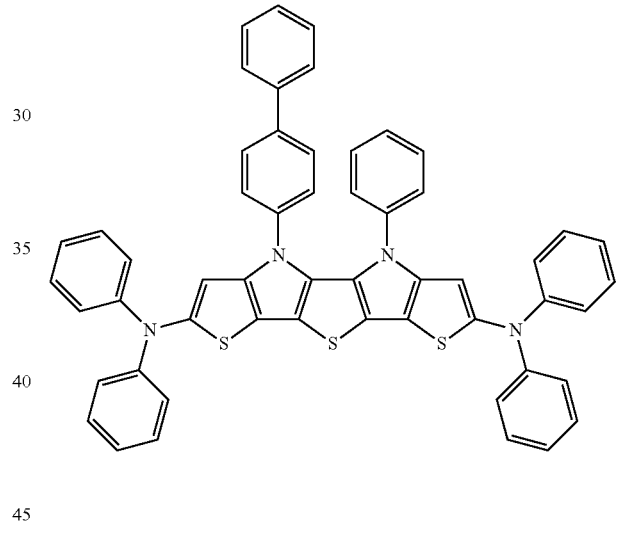
[Chemical Formula 22]
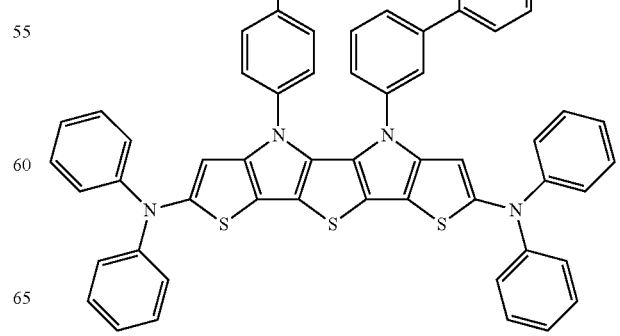

[Chemical Formula 23]
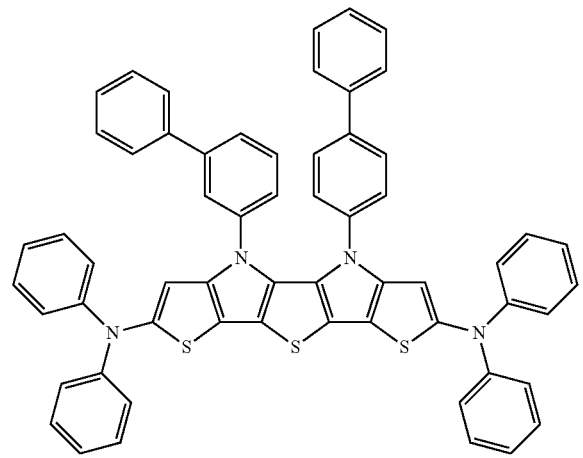
[Chemical Formula 24]
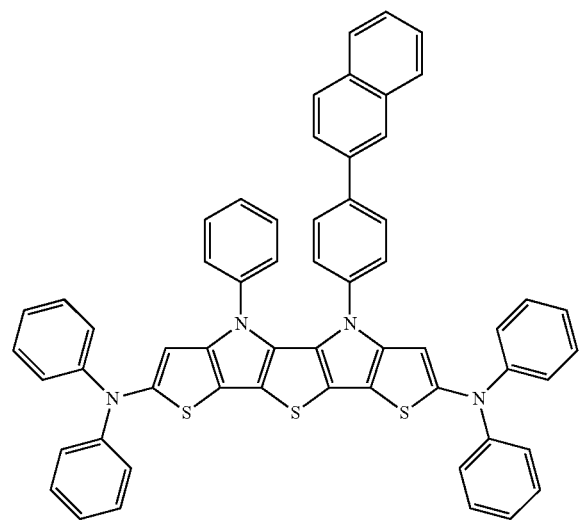
[Chemical Formula 25]
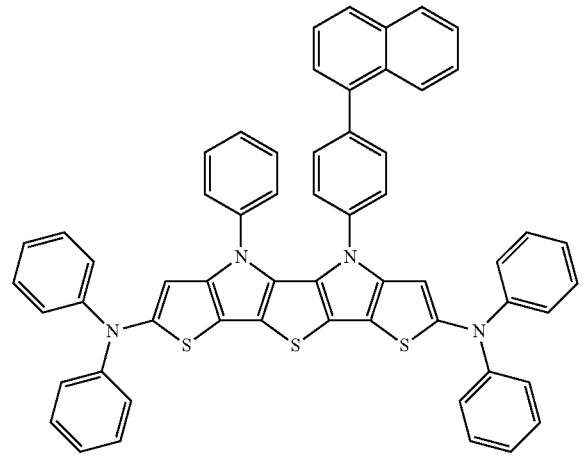
[Chemical Formula 26]
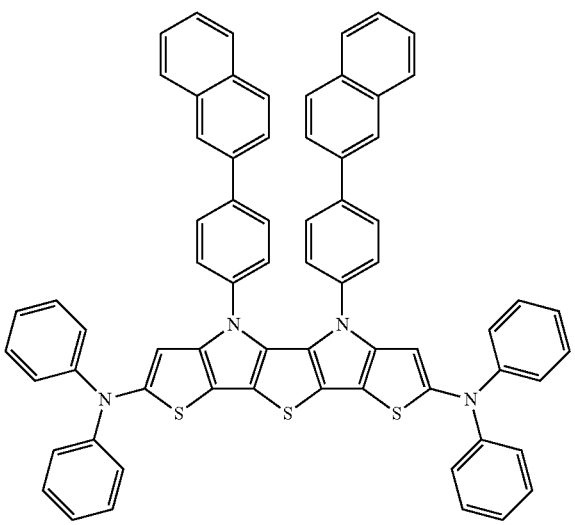
[Chemical Formula 27]
[Chemical Formula 28]
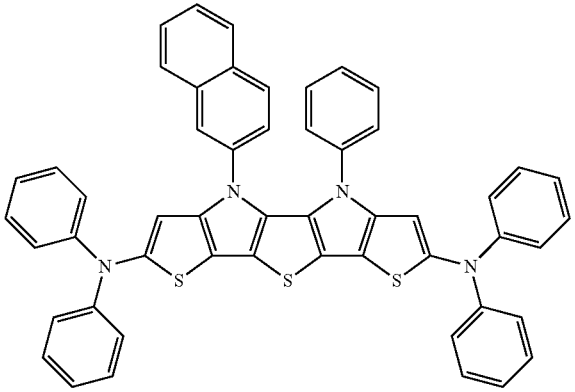

[Chemical Formula 29]
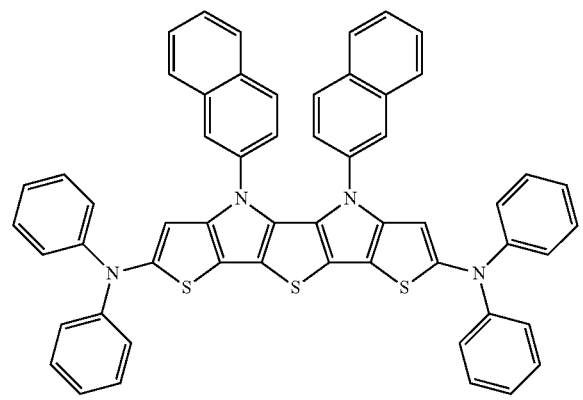
[Chemical Formula 30]
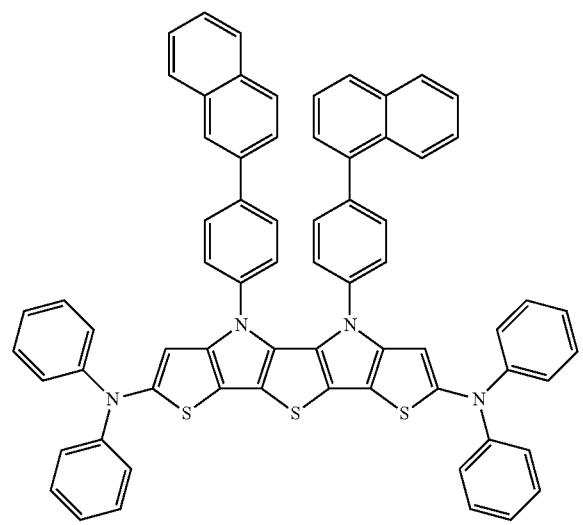
[Chemical Formula 31]
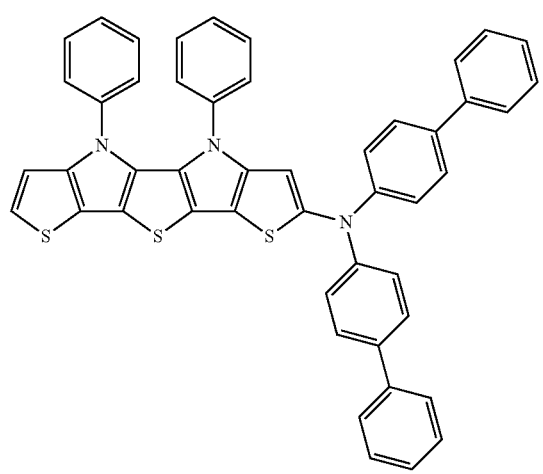
[Chemical Formula 32]
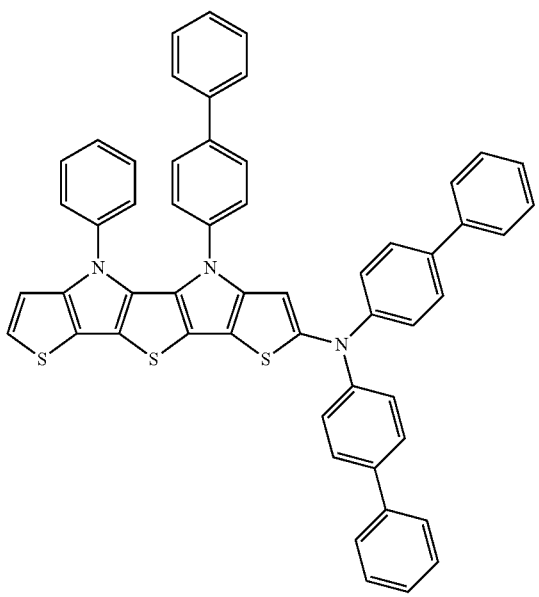
[Chemical Formula 33]
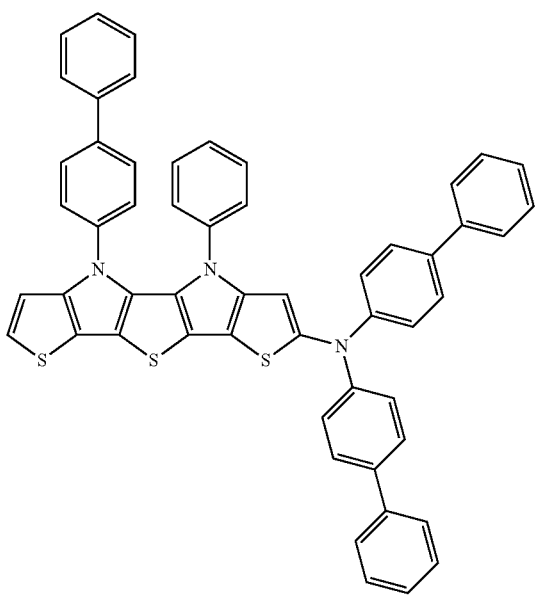

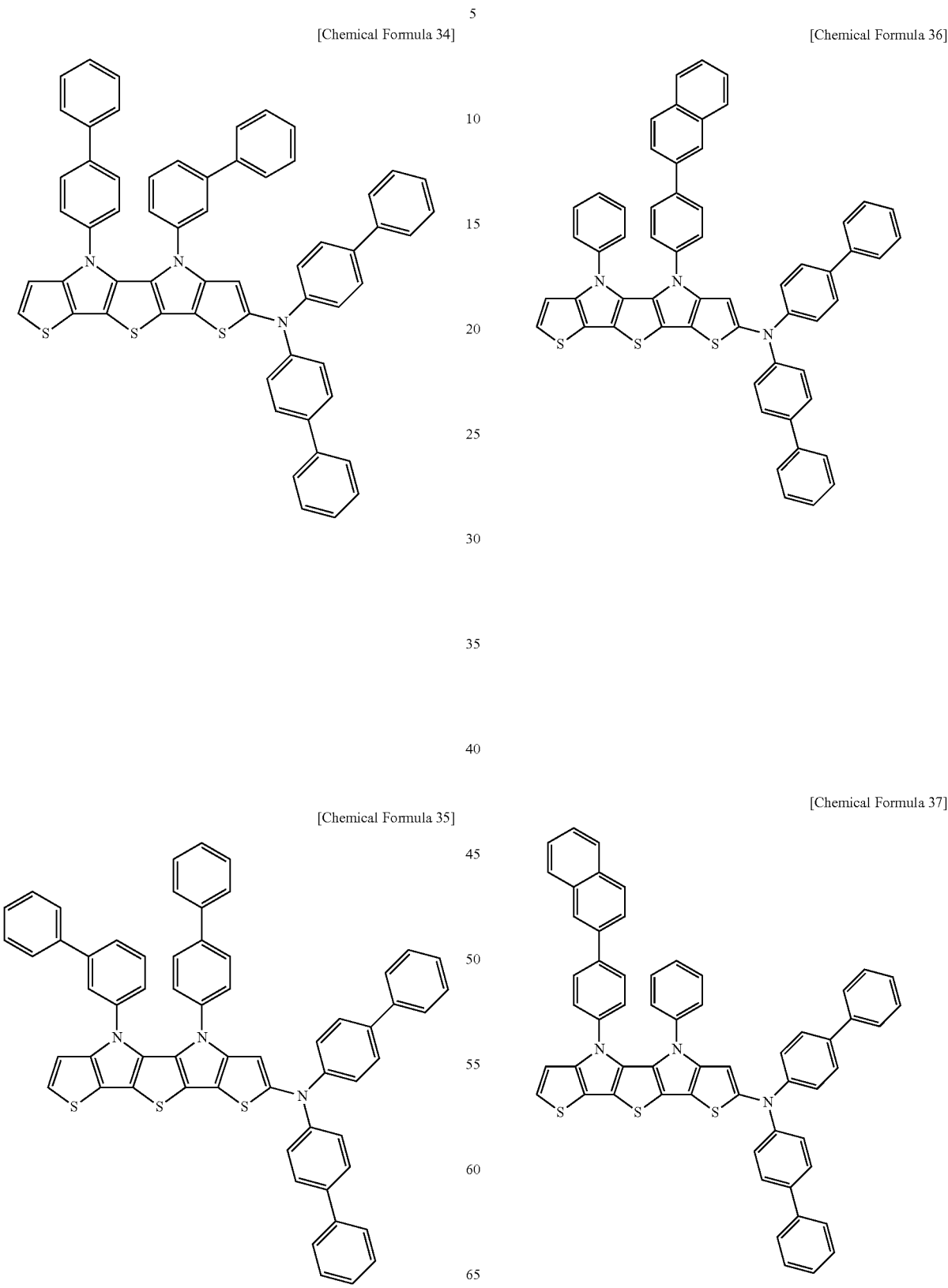
[Chemical Formula 34]
[Chemical Formula 35]
[Chemical Formula 36]
[Chemical Formula 37]

[Chemical Formula 38]
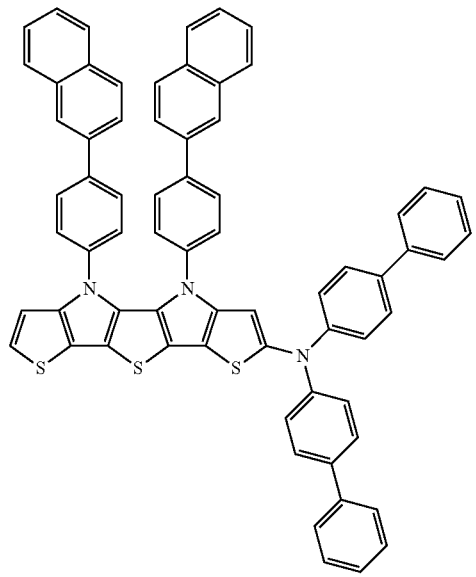
[Chemical Formula 40]
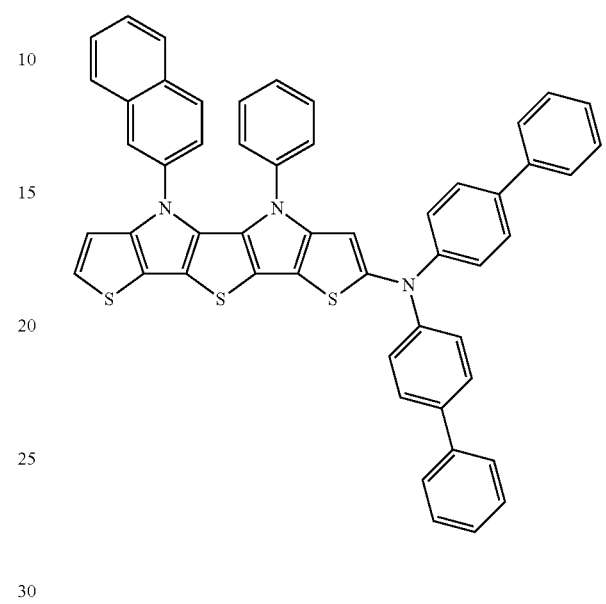
[Chemical Formula 39]
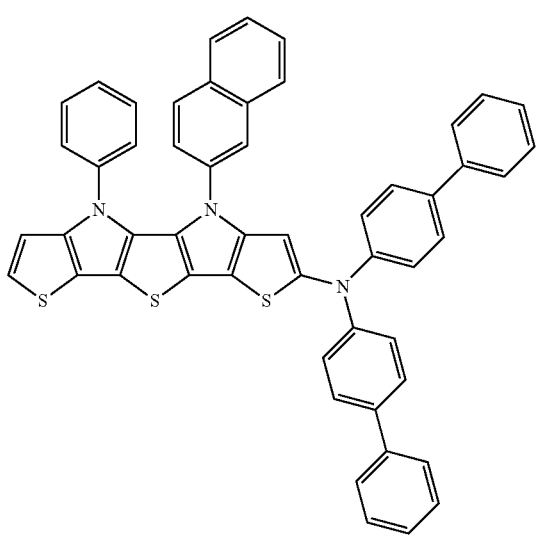
[Chemical Formula 41]
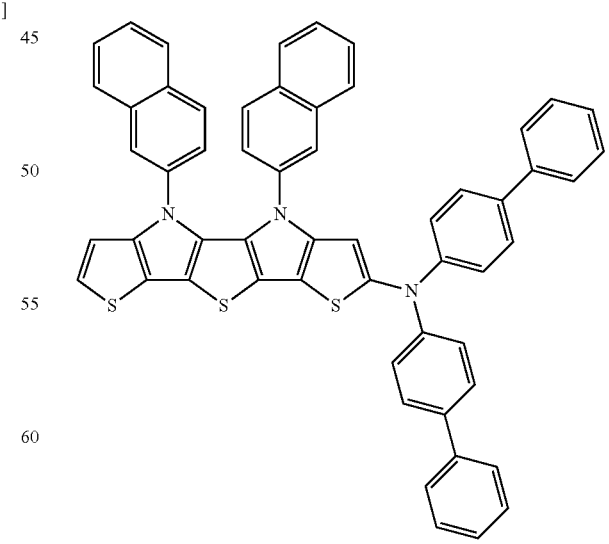

[Chemical Formula 42]
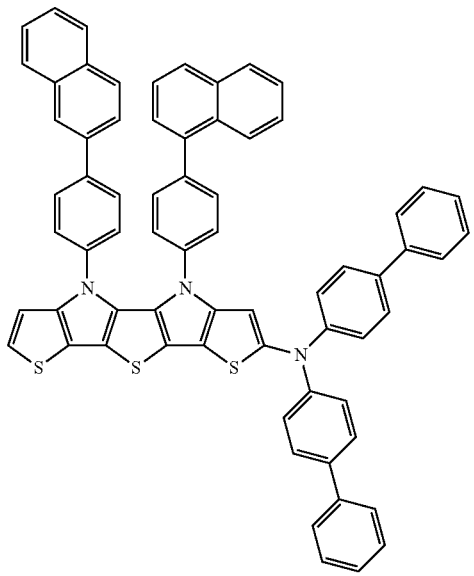
[Chemical Formula 43]
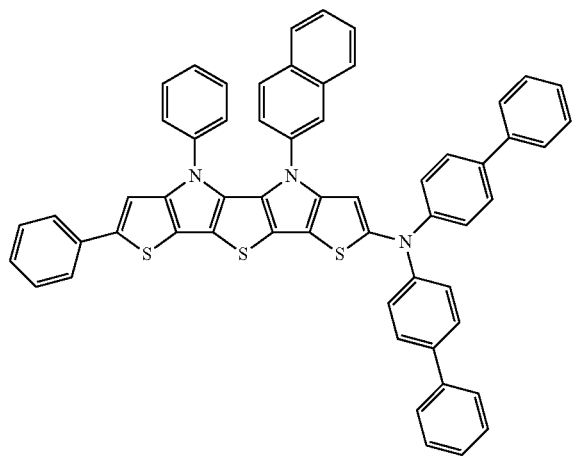
[Chemical Formula 44]
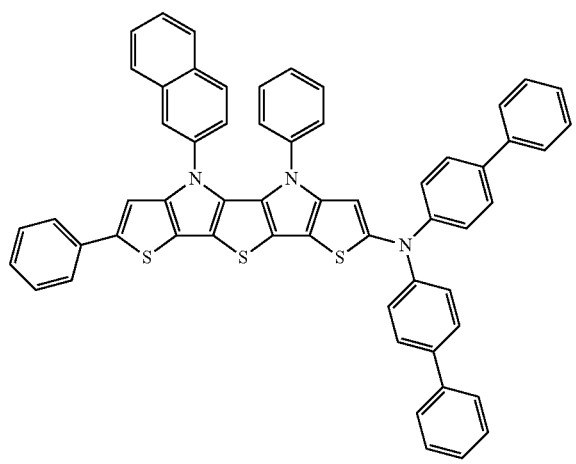
[Chemical Formula 45]
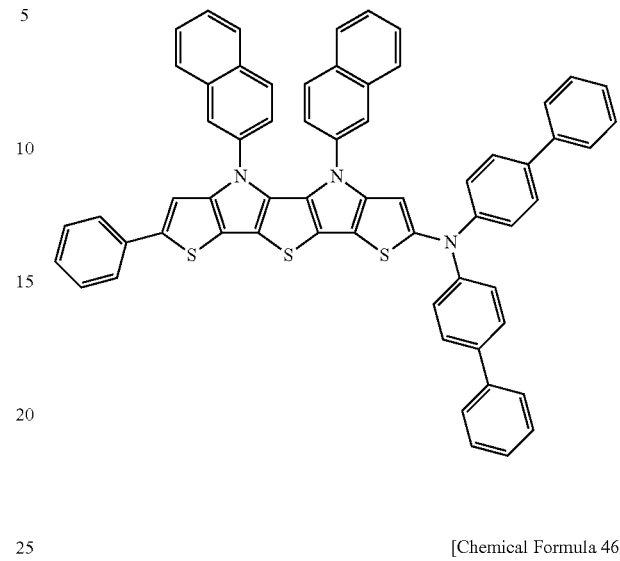
[Chemical Formula 46]
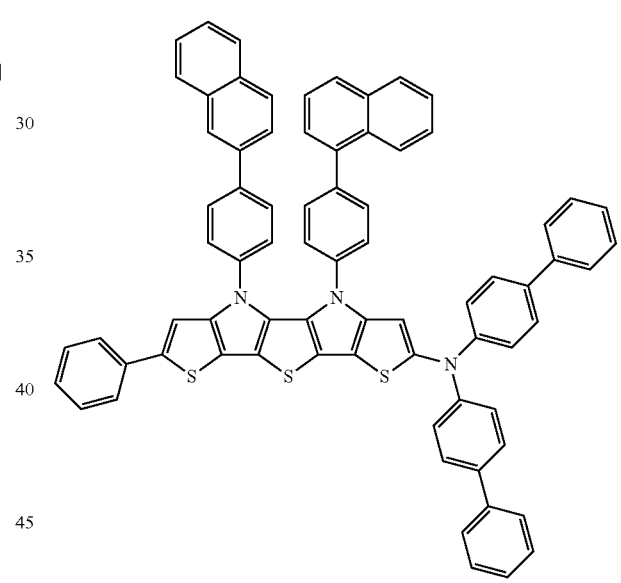
[Chemical Formula 47]
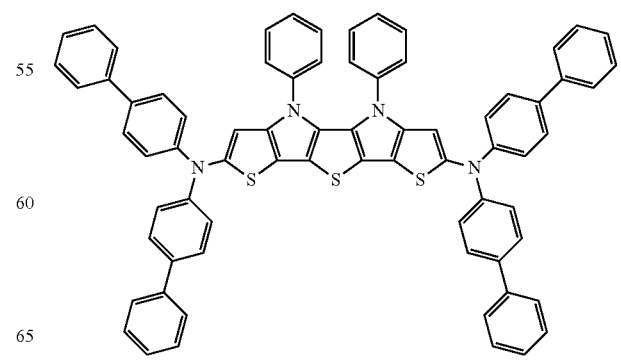

[Chemical Formula 48]
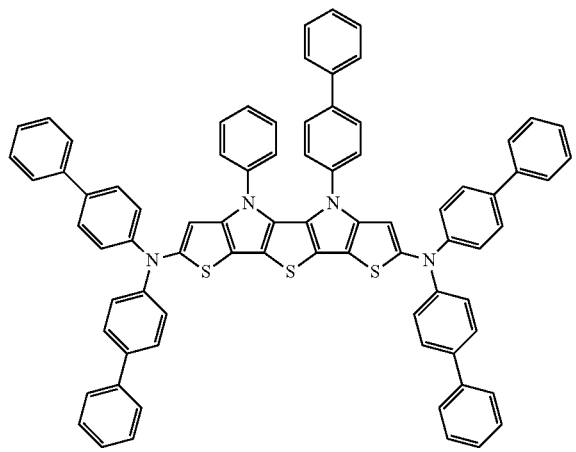
[Chemical Formula 49]
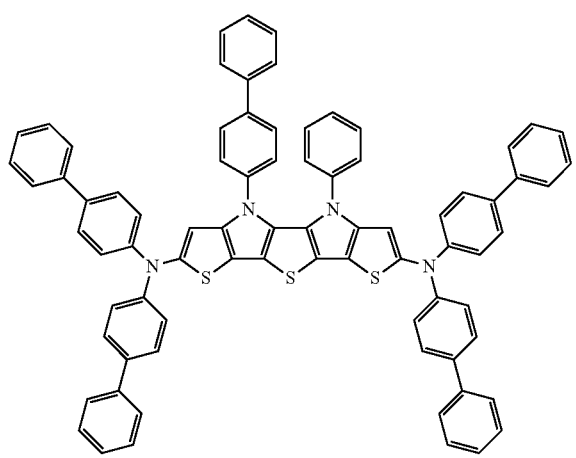
[Chemical Formula 50]
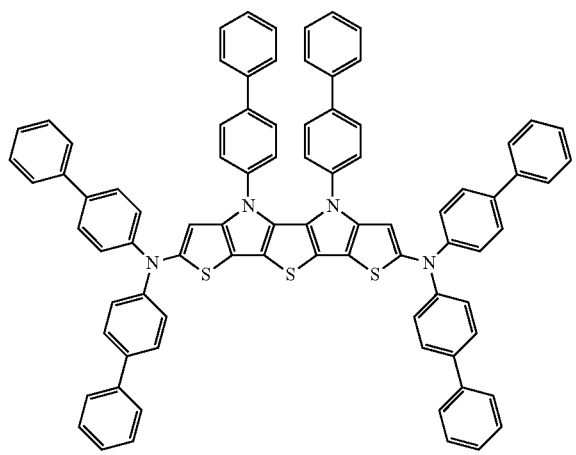
[Chemical Formula 51]
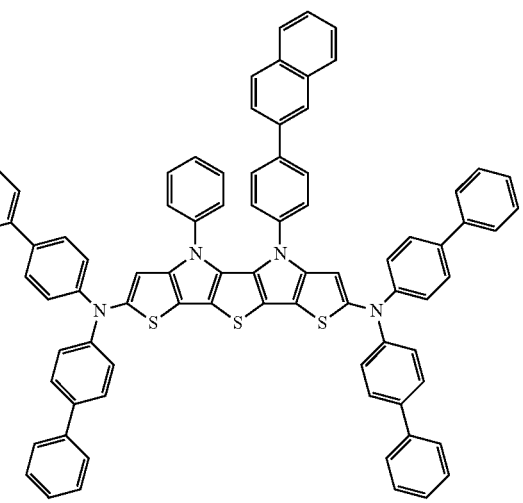
[Chemical Formula 52]
[Chemical Formula 53]
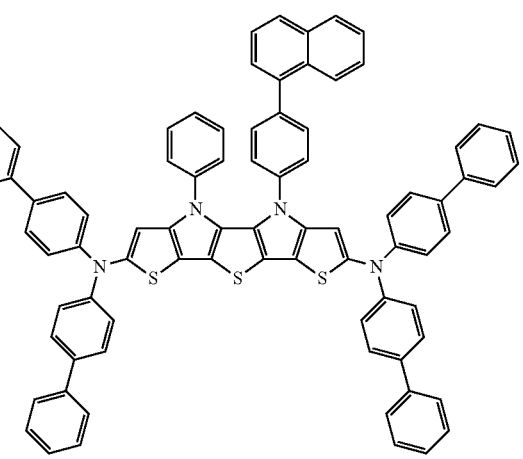

[Chemical Formula 54]

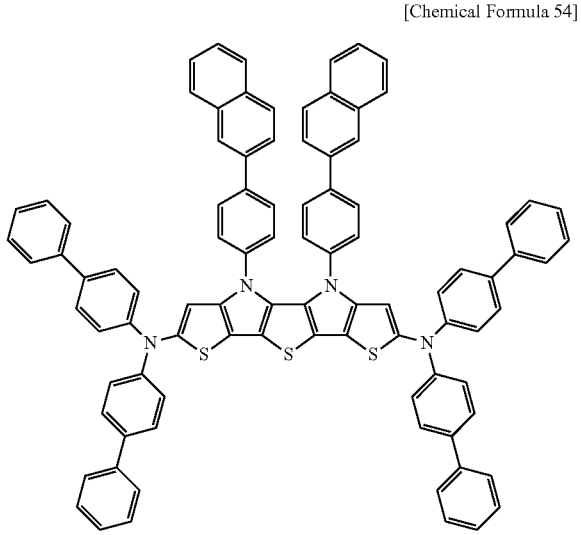

[Chemical Formula 55]

[Chemical Formula 56]

[Chemical Formula 57]

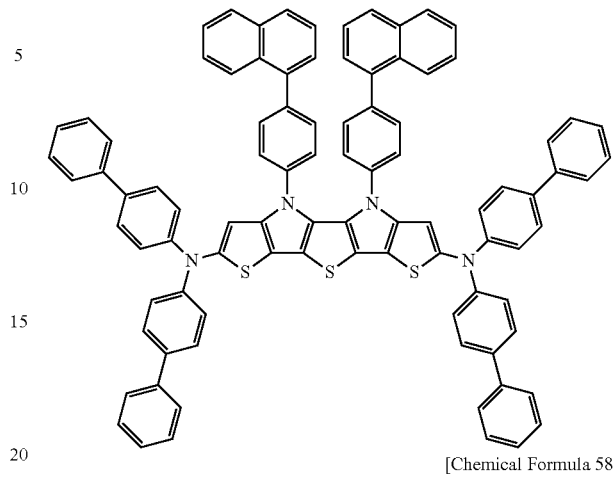

[Chemical Formula 58]

9. An organic light emitting diode device, comprising
an anode,
a cathode, and
an organic layer between the anode and the cathode,
wherein the organic layer includes the compound as claimed in claim 1.

10. The organic light emitting diode device as claimed in claim 9, wherein the organic layer includes an electron injection layer (EIL), an electron transport layer (ETL), a hole injection layer (HIL), a hole transport layer (HTL), or an emission layer.

11. The organic light emitting diode device as claimed in claim 9, wherein the organic layer includes an electron injection layer (EIL) or an electron transport layer (ETL).

12. The organic light emitting diode device as claimed in claim 11, wherein the electron transport layer (ETL) includes an electron transporting organic material and a metal-containing material.

13. The organic light emitting diode device as claimed in claim 12, wherein the metal-containing material includes a Li complex.

14. The organic light emitting diode device as claimed in claim 9, wherein the organic layer includes an emission layer.

15. The organic light emitting diode device as claimed in claim 14, wherein the compound is a host in the emission layer.

16. The organic light emitting diode device as claimed in claim 9, wherein the organic layer includes a hole injection layer (HIL) or a hole transport layer (HTL).

17. A display device comprising the organic light emitting diode device as claimed in claim 9.

* * * * *